(12) United States Patent
Son et al.

(10) Patent No.: US 11,721,284 B2
(45) Date of Patent: Aug. 8, 2023

(54) DISPLAY APPARATUS

(71) Applicant: Samsung Display Co., Ltd., Yongin-Si (KR)

(72) Inventors: Jeongman Son, Yongin-si (KR); Cheolho Lee, Yongin-si (KR); Dongik Koo, Yongin-si (KR); Youngjoo Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/946,437

(22) Filed: Sep. 16, 2022

(65) Prior Publication Data

US 2023/0206835 A1    Jun. 29, 2023

(30) Foreign Application Priority Data

Dec. 29, 2021   (KR) ........................ 10-2021-0191520

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01);
(Continued)

(58) Field of Classification Search
CPC ......... G09G 3/3233; G09G 2300/0819; G09G 2300/0842; G09G 2320/0626; G09G 2330/021; H10K 59/131
See application file for complete search history.

(56) References Cited

U.S. PATENT DOCUMENTS

| 10,679,551 B2 | 6/2020 | Yang et al. |
| 2020/0213514 A1 | 7/2020 | Kim et al. |
| 2021/0109636 A1 | 4/2021 | Lius et al. |

FOREIGN PATENT DOCUMENTS

| CN | 111710276 A | 9/2020 | |
| EP | 3889951 A1 * | 10/2021 | ............. G09G 3/035 |

(Continued)

*Primary Examiner* — Stacy Khoo
(74) *Attorney, Agent, or Firm* — Innovation Counsel LLP

(57) ABSTRACT

A display apparatus includes an auxiliary display area and a main display area surrounding the auxiliary display area while the auxiliary display area includes a component area and an intermediate area surrounding the component area, a first auxiliary pixel circuit, a first additional pixel circuit, a first separation circuit, and a $1^{st}$-$1^{st}$ additional display element that are arranged in the intermediate area while the first separation circuit includes a $1^{st}$-$1^{st}$ output terminal, a $1^{st}$-$2^{nd}$ output terminal, and a first input terminal that is electrically connected to the first additional pixel circuit, and the $1^{st}$-$1^{st}$ auxiliary display element is electrically connected to the first auxiliary pixel circuit, a $1^{st}$-$1^{st}$ and $1^{st}$-$2^{nd}$ additional display elements arranged in the component area, a $1^{st}$-$1^{st}$ connection wire electrically connecting the $1^{st}$-$1^{st}$ output terminal to the $1^{st}$-$1^{st}$ additional display element, and a $1^{st}$-$2^{nd}$ connection wire electrically connecting the $1^{st}$-$2^{nd}$ output terminal to the $1^{st}$-$2^{nd}$ additional display element.

26 Claims, 12 Drawing Sheets

(52) U.S. Cl.
CPC .............. *G09G 2300/0842* (2013.01); *G09G 2320/0626* (2013.01); *G09G 2330/021* (2013.01)

(56) References Cited

FOREIGN PATENT DOCUMENTS

| KR | 10-2016-0092145 A | 8/2016 |
| KR | 10-2019-0015664 A | 2/2019 |
| KR | 10-2020-0079868 A | 7/2020 |
| KR | 10-2021-0043441 A | 4/2021 |

* cited by examiner

DISPLAY APPARATUS

CROSS-REFERENCE TO RELATED APPLICATION

This application is based on and claims priority under 35 U.S.C. § 119 to Korean Patent Application No. 10-2021-0191520, filed on Dec. 29, 2021, in the Korean Intellectual Property Office, the disclosure of which is incorporated by reference herein in its entirety.

BACKGROUND

1. Field

One or more embodiments relate to a display apparatus, and more particularly, to a display apparatus capable of displaying high-quality images.

2. Description of the Related Art

In general, in a display apparatus such as an organic light-emitting display apparatus, thin-film transistors are arranged in each (sub) pixel to control the luminance of each (sub) pixel. These thin-film transistors control the luminance of the corresponding (sub) pixels according to a transmitted data signal, etc.

SUMMARY

However, such a conventional display apparatus has a problem in that the conventional display apparatus cannot display a high-quality image in an area where a camera is located.

One or more embodiments include a display apparatus capable of displaying high-quality images. However, this is merely an example, and the scope of the disclosure is not limited thereto.

Additional aspects will be set forth in part in the description which follows and, in part, will be apparent from the description, or may be learned by practice of the presented embodiments of the disclosure.

One or more embodiments include a display apparatus including a substrate including an auxiliary display area and a main display area surrounding the auxiliary display area, the auxiliary display area including a component area and an intermediate area, a first auxiliary pixel circuit, a first additional pixel circuit, a first separation circuit, and a $1^{st}$-$1^{st}$ auxiliary display element that are arranged in the intermediate area, the first separation circuit having a first input terminal that is electrically connected to the first additional pixel circuit, a $1^{st}$-$1^{st}$ output terminal, and a $1^{st}$-$2^{nd}$ output terminal, a $1^{st}$-$1^{st}$ auxiliary display element electrically connected to the first auxiliary pixel circuit, a $1^{st}$-$1^{st}$ additional display element and a $1^{st}$-$2^{nd}$ additional display element that are arranged in the component area, a $1^{st}$-$1^{st}$ connection wire electrically connecting the $1^{st}$-$1^{st}$ output terminal to the $1^{st}$-$1^{st}$ additional display element, and a $1^{st}$-$2^{nd}$ connection wire electrically connecting the $1^{st}$-$2^{nd}$ output terminal to the $1^{st}$-$2^{nd}$ additional display element.

The display apparatus may further include a second additional pixel circuit in the intermediate area, a second separation circuit arranged in the intermediate area and having a $2^{nd}$-$1^{st}$ output terminal, a $2^{nd}$-$2^{nd}$ output terminal, and a second input terminal that is electrically connected to the second additional pixel circuit, a $2^{nd}$-$1^{st}$ additional display element and a $2^{nd}$-$2^{nd}$ additional display element arranged in the component area, a $2^{nd}$-$1^{st}$ connection wire electrically connecting the $2^{nd}$-$1^{st}$ output terminal to the $2^{nd}$-$1^{st}$ additional display element, a $2^{nd}$-$2^{nd}$ connection wire electrically connecting the $2^{nd}$-$2^{nd}$ output terminal to the $2^{nd}$-$2^{nd}$ additional display element.

The first separation circuit may include a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the second separation circuit may include a $2^{nd}$-$1^{st}$ transistor connecting the second input terminal to the $2^{nd}$-$1^{st}$ output terminal and a $2^{nd}$-$2^{nd}$ transistor connecting the second input terminal to the $2^{nd}$-$2^{nd}$ output terminal.

The display apparatus may further include a first signal line applying an electrical signal to a gate electrode of the $1^{st}$-$1^{st}$ transistor and a gate electrode of the $2^{nd}$-$1^{st}$ transistor, and a second signal line applying an electrical signal to a gate electrode of the $1^{st}$-$2^{nd}$ transistor and a gate electrode of the $2^{nd}$-$2^{nd}$ transistor.

When the $1^{st}$-$1^{st}$ transistor and the $2^{nd}$-$1^{st}$ transistor are turned on through the first signal line, the $1^{st}$-$2^{nd}$ transistor and the $2^{nd}$-$2^{nd}$ transistor may be turned off, and when the $1^{st}$-$2^{nd}$ transistor and the $2^{nd}$-$2^{nd}$ transistor are turned on through the second signal line, the $1^{st}$-$1^{st}$ transistor and the $2^{nd}$-$1^{st}$ transistor may be turned off.

The display apparatus may further include a first auxiliary separation circuit arranged in the intermediate area and having a $1^{st}$-$1^{st}$ auxiliary output terminal, a $1^{st}$-$2^{nd}$ auxiliary output terminal, and a first auxiliary input terminal that is electrically connected to the first auxiliary pixel circuit, and a $1^{st}$-$2^{nd}$ auxiliary display element arranged in the intermediate area and electrically connected to the $1^{st}$-$2^{nd}$ auxiliary output terminal, wherein the $1^{st}$-$1^{st}$ auxiliary display element may be electrically connected to the $1^{st}$-$1^{st}$ auxiliary output terminal.

The display apparatus may further include a second auxiliary pixel circuit arranged in the intermediate area, a second auxiliary separation circuit arranged in the intermediate area and having a $2^{nd}$-$1^{st}$ auxiliary output terminal, a $2^{nd}$-$2^{nd}$ auxiliary output terminal, and a second auxiliary input terminal that is electrically connected to the second auxiliary pixel circuit, a $2^{nd}$-$1^{st}$ auxiliary display element electrically connected to the $2^{nd}$-$1^{st}$ auxiliary output terminal and arranged in the intermediate area, and a $2^{nd}$-$2^{nd}$ auxiliary display element electrically connected to the $2^{nd}$-$2^{nd}$ auxiliary output terminal and arranged in the intermediate area.

The first auxiliary separation circuit may include a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal, and the second auxiliary separation circuit may include a $2^{nd}$-$1^{st}$ auxiliary transistor connecting the second auxiliary input terminal to the $2^{nd}$-$1^{st}$ auxiliary output terminal and a $2^{nd}$-$2^{nd}$ auxiliary transistor connecting the second auxiliary input terminal to the $2^{nd}$-$2^{nd}$ auxiliary output terminal.

The display apparatus may further include a first auxiliary signal line applying an electrical signal to a gate electrode of the $1^{st}$-$1^{st}$ auxiliary transistor and a gate electrode of the $2^{nd}$-$1^{st}$ auxiliary transistor, and a second auxiliary signal line applying an electrical signal to a gate electrode of the $1^{st}$-$2^{nd}$ auxiliary transistor and a gate electrode of the $2^{nd}$-$2^{nd}$ auxiliary transistor.

When the $1^{st}$-$1^{st}$ auxiliary transistor and the $2^{nd}$-$1^{st}$ auxiliary transistor are turned on through the first auxiliary signal line, the $1^{st}$-$2^{nd}$ auxiliary transistor and the $2^{nd}$-$2^{nd}$ auxiliary transistor may be turned off, and when the $1^{st}$-$2^{nd}$ auxiliary transistor and the $2^{nd}$-$2^{nd}$ auxiliary transistor are turned on through the second auxiliary signal line, the $1^{st}$-$1^{st}$ auxiliary transistor and the $2^{nd}$-$1^{st}$ auxiliary transistor may be turned off.

The first separation circuit may include a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the first auxiliary separation circuit may include a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal.

The display apparatus may further include a first signal line applying an electrical signal to a gate electrode of the $1^{st}$-$1^{st}$ transistor and a gate electrode of the $1^{st}$-$1^{st}$ auxiliary transistor, and a second signal line applying an electrical signal to a gate electrode of the $1^{st}$-$2^{nd}$ transistor and a gate electrode of the $1^{st}$-$2^{nd}$ auxiliary transistor.

When the $1^{st}$-$1^{st}$ transistor and the $1^{st}$-$1^{st}$ auxiliary transistor are turned on through the first signal line, the $1^{st}$-$2^{nd}$ transistor and the $1^{st}$-$2^{nd}$ auxiliary transistor may be turned off, and when the $1^{st}$-$2^{nd}$ transistor and the $1^{st}$-$2^{nd}$ auxiliary transistor are turned on through the second signal line, the $1^{st}$-$1^{st}$ transistor and the $1^{st}$-$1^{st}$ auxiliary transistor may be turned off.

One or more embodiments include a display apparatus including a substrate including an auxiliary display area and a main display area surrounding the auxiliary display area, the auxiliary display area including a component area and an intermediate area, a first auxiliary pixel circuit, a first additional pixel circuit, and a $1^{st}$-$1^{st}$ auxiliary display element that are arranged in the intermediate area, the $1^{st}$-$1^{st}$ auxiliary display element being electrically connected to the first auxiliary pixel circuit, a first separation circuit, a $1^{st}$-$1^{st}$ additional display element, and a $1^{st}$-$2^{nd}$ additional display element that are arranged in the component area, the first separation circuit including a $1^{st}$-$1^{st}$ output terminal, a $1^{st}$-$2^{nd}$ output terminal, and a first input terminal, the $1^{st}$-$1^{st}$ additional display element being electrically connected to the $1^{st}$-$1^{st}$ output terminal, the $1^{st}$-$2^{nd}$ additional display element being electrically connected to the $1^{st}$-$2^{nd}$ output terminal, and a first connection wire electrically connecting the first additional pixel circuit to the first input terminal.

The display apparatus may further include a second additional pixel circuit in the intermediate area, a second separation circuit, a $2^{nd}$-$1^{st}$ additional display element, and a $2^{nd}$-$2^{nd}$ additional display element that are arranged in the component area, the second separation circuit including a $2^{nd}$-$1^{st}$ output terminal, a $2^{nd}$-$2^{nd}$ output terminal, and a second input terminal, the $2^{nd}$-$1^{st}$ additional display element being electrically connected to the $2^{nd}$-$1^{st}$ output terminal, the $2^{nd}$-$2^{nd}$ additional display element being electrically connected to the $2^{nd}$-$2^{nd}$ output terminal, and a second connection wire electrically connecting the second additional pixel circuit to the second input terminal.

The first separation circuit may include a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the second separation circuit may include a $2^{nd}$-$1^{st}$ transistor connecting the second input terminal to the $2^{nd}$-$1^{st}$ output terminal and a $2^{nd}$-$2^{nd}$ transistor connecting the second input terminal to the $2^{nd}$-$2^{nd}$ output terminal.

The display apparatus may further include a first signal line applying an electrical signal to a gate electrode of the $1^{st}$-$1^{st}$ transistor and a gate electrode of the $2^{nd}$-$1^{st}$ transistor, and a second signal line applying an electrical signal to a gate electrode of the $1^{st}$-$2^{nd}$ transistor and a gate electrode of the $2^{nd}$-$2^{nd}$ transistor.

When the $1^{st}$-$1^{st}$ transistor and the $2^{nd}$-$1^{st}$ transistor are turned on through the first signal line, the $1^{st}$-$2^{nd}$ transistor and the $2^{nd}$-$2^{nd}$ transistor may be turned off, and when the $1^{st}$-$2^{nd}$ transistor and the $2^{nd}$-$2^{nd}$ transistor are turned on through the second signal line, the $1^{st}$-$1^{st}$ transistor and the $2^{nd}$-$1^{st}$ transistor may be turned off.

The display apparatus may further include a first auxiliary separation circuit arranged in the intermediate area and having a $1^{st}$-$1^{st}$ auxiliary output terminal, a $1^{st}$-$2^{nd}$ auxiliary output terminal, and a first auxiliary input terminal that is electrically connected to the first auxiliary pixel circuit, and a $1^{st}$-$2^{nd}$ auxiliary display element arranged in the intermediate area and electrically connected to the $1^{st}$-$2^{nd}$ auxiliary output terminal, wherein the $1^{st}$-$1^{st}$ auxiliary display element may be electrically connected to the $1^{st}$-$1^{st}$ auxiliary output terminal.

The display apparatus may further include a second auxiliary pixel circuit arranged in the intermediate area, a second auxiliary separation circuit arranged in the intermediate area and having a $2^{nd}$-$1^{st}$ auxiliary output terminal, a $2^{nd}$-$2^{nd}$ auxiliary output terminal, and a second auxiliary input terminal that is electrically connected to the second auxiliary pixel circuit, a $2^{nd}$-$1^{st}$ auxiliary display element electrically connected to the $2^{nd}$-$1^{st}$ auxiliary output terminal in the intermediate area, and a $2^{nd}$-$2^{nd}$ auxiliary display element electrically connected to the $2^{nd}$-$2^{nd}$ auxiliary output terminal in the intermediate area.

The first auxiliary separation circuit may include a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal, and the second auxiliary separation circuit may include a $2^{nd}$-$1^{st}$ auxiliary transistor connecting the second auxiliary input terminal to the $2^{nd}$-$1^{st}$ auxiliary output terminal and a $2^{nd}$-$2^{nd}$ auxiliary transistor connecting the second auxiliary input terminal to the $2^{nd}$-$2^{nd}$ auxiliary output terminal.

The display apparatus may further include a first auxiliary signal line applying an electrical signal to a gate electrode of the $1^{st}$-$1^{st}$ auxiliary transistor and a gate electrode of the $2^{nd}$-$1^{st}$ auxiliary transistor, and a second auxiliary signal line applying an electrical signal to a gate electrode of the $1^{st}$-$2^{nd}$ auxiliary transistor and a gate electrode of the $2^{nd}$-$2^{nd}$ auxiliary transistor.

When the $1^{st}$-$1^{st}$ auxiliary transistor and the $2^{nd}$-$1^{st}$ auxiliary transistor are turned on through the first auxiliary signal line, the $1^{st}$-$2^{nd}$ auxiliary transistor and the $2^{nd}$-$2^{nd}$ auxiliary transistor may be turned off, and when the $1^{st}$-$2^{nd}$ auxiliary transistor and the $2^{nd}$-$2^{nd}$ auxiliary transistor are turned on through the second auxiliary signal line, the $1^{st}$-$1^{st}$ auxiliary transistor and the $2^{nd}$-$1^{st}$ auxiliary transistor may be turned off.

The first separation circuit may include a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the first auxiliary separation circuit may include a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal.

The display apparatus may further include a first signal line applying an electrical signal to a gate electrode of the $1^{st}$-$1^{st}$ transistor and a gate electrode of the $1^{st}$-$1^{st}$ auxiliary transistor, and a second signal line applying an electrical signal to a gate electrode of the $1^{st}$-$2^{nd}$ transistor and a gate electrode of the $1^{st}$-$2^{nd}$ auxiliary transistor.

When the $1^{st}$-$1^{st}$ transistor and the $1^{st}$-$1^{st}$ auxiliary transistor are turned on through the first signal line, the $1^{st}$-$2^{nd}$ transistor and the $1^{st}$-$2^{nd}$ auxiliary transistor may be turned off, and when the $1^{st}$-$2^{nd}$ transistor and the $1^{st}$-$2^{nd}$ auxiliary transistor are turned on through the second signal line, the $1^{st}$-$1^{st}$ transistor and the $1^{st}$-$1^{st}$ auxiliary transistor may be turned off.

These and/or other aspects will become apparent and more readily appreciated from the following description of the embodiments, taken in conjunction with the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
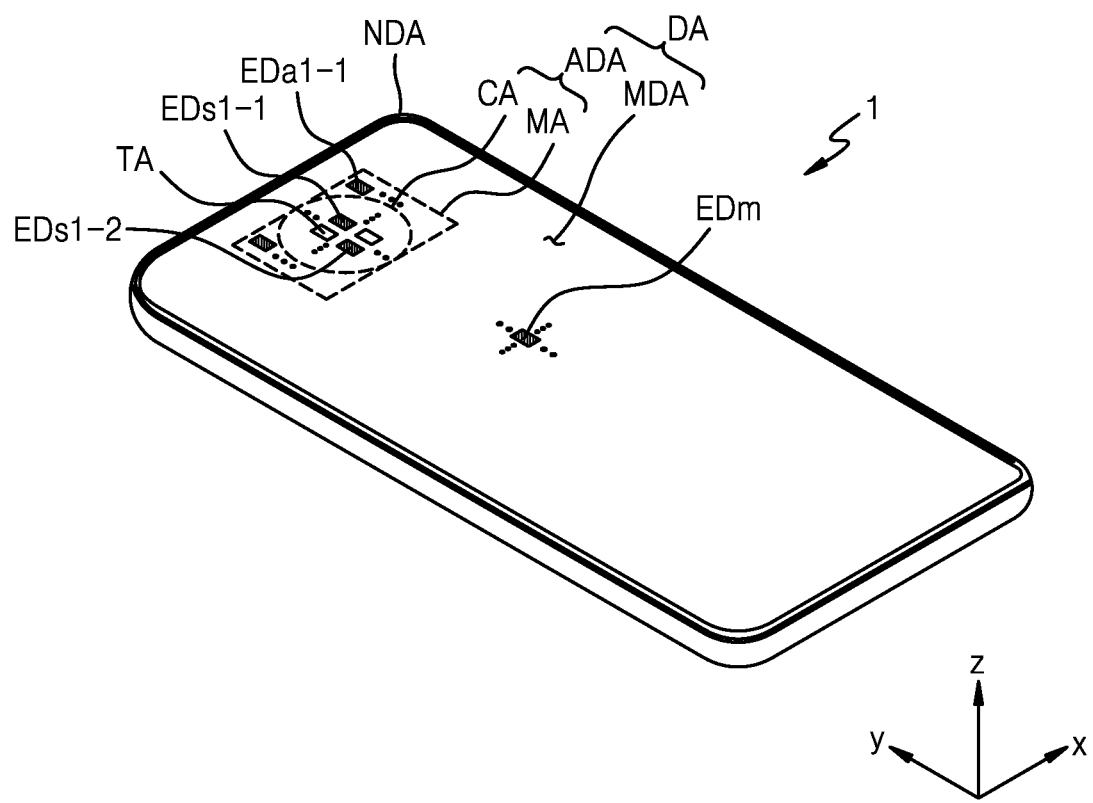
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Throughout the disclosure, the expression "at least one of a, b or c" indicates only a, only b, only c, both a and b, both a and c, both b and c, all of a, b, and c, or variations thereof.

Since the disclosure may have diverse modified embodiments, certain embodiments are illustrated in the drawings and are described in the detailed description. Advantages and features of the disclosure, and implementation methods thereof will be clarified through following embodiments described with reference to the accompanying drawings. The disclosure may, however, be embodied in many different forms and should not be construed as limited to the embodiments set forth herein.

Reference will now be made in detail to embodiments, examples of which are illustrated in the accompanying drawings, wherein like reference numerals refer to like elements throughout, and repeated description thereof will be omitted.

It will be understood that when a layer, region, or component is referred to as being "formed on" another layer, region, or component, it can be directly or indirectly formed on the other layer, region, or component. That is, for example, intervening layers, regions, or components may be present. Sizes of components in the drawings may be exaggerated for convenience of explanation. In other words, since sizes and thicknesses of components in the drawings are arbitrarily illustrated for convenience of description, the following embodiments are not limited thereto.

In the following embodiments, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another.

FIG. 1 is a perspective view of a display apparatus 1 according to an embodiment. For reference, hereinafter, a pixel may be understood to mean a sub-pixel.

Referring to FIG. 1, a display apparatus 1 according to the present embodiment includes a display area DA and a peripheral area NDA outside the display area DA. The display area DA includes an auxiliary display area ADA and a main display area MDA surrounding the auxiliary display area ADA. The auxiliary display area ADA displays an auxiliary image, and the main display area MDA displays a main image, so that the auxiliary display area ADA and the main display area MDA may display images individually or together. The peripheral area NDA may be a kind of non-display area in which display elements are not arranged. The display area DA may be surrounded by the peripheral area NDA.

FIG. 1 illustrates that the display apparatus 1 has one auxiliary display area ADA, and the main display area MDA surrounds the one auxiliary display area ADA. However, the disclosure is not limited thereto. For example, the display apparatus 1 may have a plurality of auxiliary display areas ADA, and the main display area MDA may surround the plurality of auxiliary display areas ADA and may be disposed between the plurality of auxiliary display areas ADA. In this case, shapes and sizes of the plurality of auxiliary display areas ADA may be different from each other.

When viewed from a direction substantially perpendicular to an upper surface of the display apparatus 1 (a z-axis direction), the auxiliary display area ADA may have various shapes, such as a circle shape, an ellipse shape, or a polygonal shape such as a square shape, a star shape, or a diamond shape. In addition, in FIG. 1, when viewed from the direction substantially perpendicular to the upper surface of the display apparatus 1 (the z-axis direction), the auxiliary display area ADA is disposed at an upper center of the main display area MDA (in a +y-direction), which has a substantially rectangular shape, but the auxiliary display area ADA may be disposed on one side of the rectangular main display area MDA, for example, on an upper right side or an upper left side of the rectangular main display area MDA.

The display apparatus 1 may provide an image using a plurality of main display elements EDm arranged in the main display area MDA, and a $1^{st}$-$1^{st}$ auxiliary display element EDa1-1 and additional display elements EDs1-1 and EDs1-2 arranged in the auxiliary display area ADA. The auxiliary display area ADA may include a component area CA and an intermediate area MA that at least partially surrounds the component area CA. Accordingly, the intermediate area MA may be disposed between the component area CA and the main display area MDA.

Figure 2:
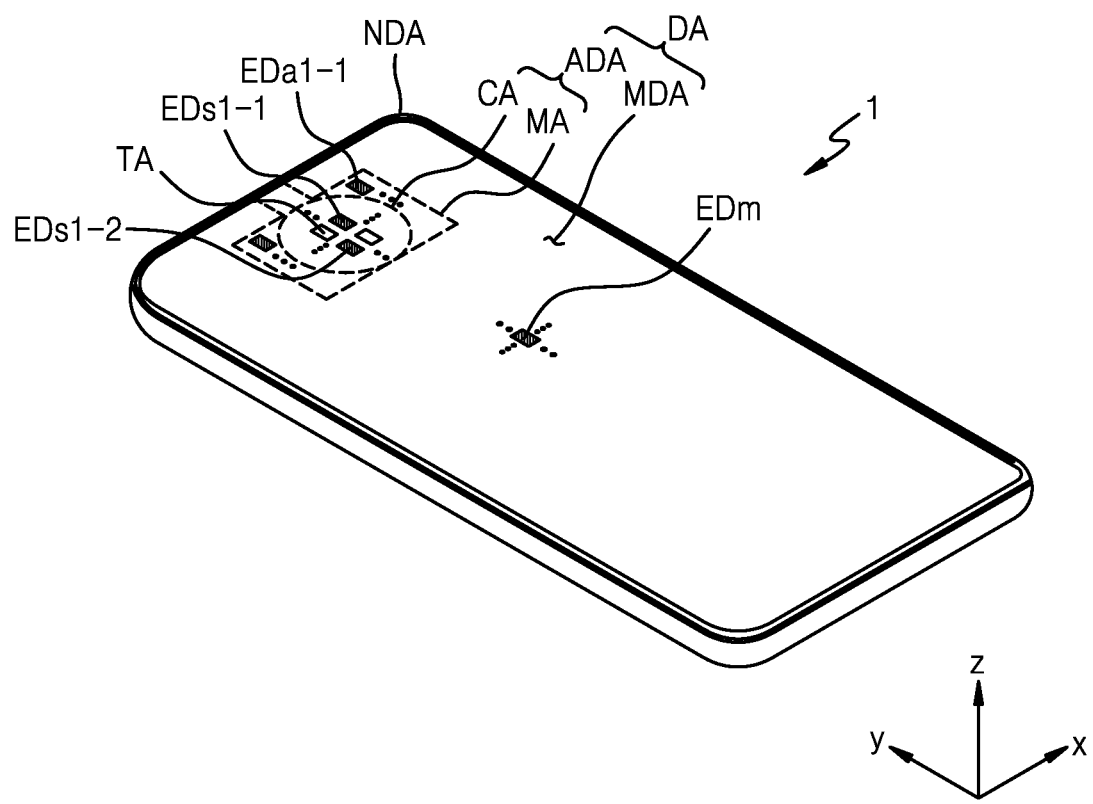
FIG. 2 is a perspective view of a display apparatus according to an embodiment.
Figure 3:
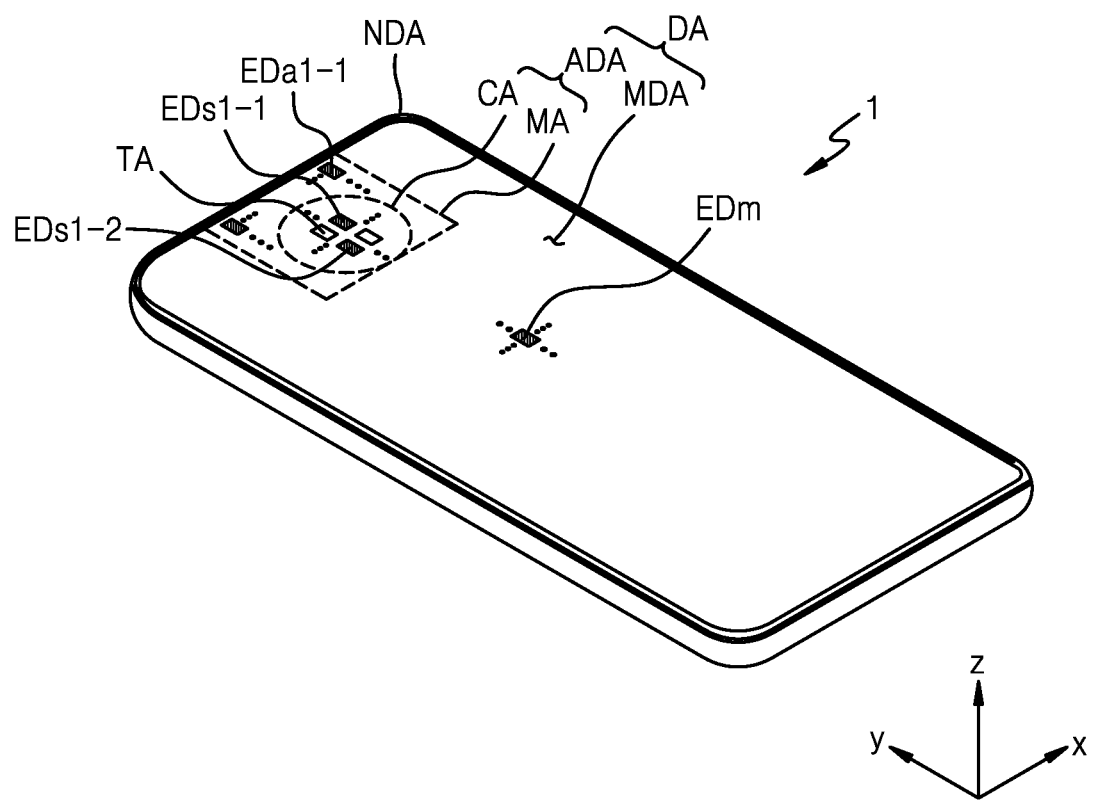
FIG. 3 is a perspective view of a display apparatus according to an embodiment.

Although the shape of the component area CA is the same or similar, the shape of the intermediate area MA may be variously modified, and thus, the shape of the auxiliary display area ADA may vary. For example, as shown in FIG. 1, the auxiliary display area ADA may be located within the main display area MDA and surrounded by the main display area MDA. Alternatively, as shown in FIG. 2, which is a perspective view schematically showing a display apparatus according to an embodiment, the auxiliary display area ADA may have a narrow portion extending in a direction from the auxiliary display area ADA to the peripheral area NDA (a +y direction). Alternatively, as shown in FIG. 3, which is a perspective view schematically showing a display apparatus 1 according to an embodiment, one side (in the +y direction) of the auxiliary display area ADA may be in contact with the peripheral area NDA.

In the component area CA, as will be described later with reference to FIG. 4, a component 40 (see FIG. 4), which is an electronic element, may be disposed below a display panel 10 (see FIG. 4) to correspond to the component area CA. The component area CA may include a transmission area TA through which light and/or sound output from the component 40 to the outside or traveling toward the component 40 from the outside may pass.

The component 40 may be an electronic element using light or sound. For example, the electronic element may be a sensor that measures a distance, such as a proximity sensor, a sensor that recognizes a part of a user's body (e.g., fingerprint, iris, face, etc.), a small lamp that outputs light, or an image sensor that captures an image (e.g., a camera). Electronic elements using light may use light of various wavelength bands, such as visible light, infrared light, or ultraviolet light. Electronic elements using sound may use ultrasonic waves or sound of another frequency band. In some embodiments, the component 40 may include subcomponents such as a light-emitting unit and a light-receiving unit. The component 40 may include an integrated light emitting unit and light-receiving unit, or may include a pair of light emitting units and light receiving units that are physically separated.

In a case of the display apparatus 1 according to an embodiment, when light is transmitted through the component area CA, the light transmittance may be at least about 10%, at least about 20%, at least about 30%, at least about 40%, at least about 50%, at least about 60%, at least about 70%, at least about 75%, at least about 80%, at least about 85%, or at least about 90%.

The $1^{st}$-$1^{st}$ auxiliary display element EDa1-1 and the additional display elements EDs1-1 and EDs1-2 may be arranged in the auxiliary display area ADA. The $1^{st}$-$1^{st}$ auxiliary display element EDa1-1 may be in the intermediate area MA, and the additional display elements EDs1-1 and EDs1-2 may be in the component area CA.

The $1^{st}$-$1^{st}$ auxiliary display element EDa1-1 and the additional display elements EDs1-1 and EDs1-2 emit light to implement a certain image. An image displayed in the auxiliary display area ADA is an auxiliary image, and may have a lower resolution than that of an image displayed in the main display area MDA. That is, because the component area CA in the auxiliary display area ADA has the transmission area TA through which light and sound may pass, when no pixels are arranged in the transmission area TA, the number of display elements arranged per unit area in the component area CA may be less than the number of display elements, for example, main display elements EDm, arranged per unit area in the main display area MDA.

In addition, the intermediate area MA in the auxiliary display area ADA does not include the transmission area TA, but some pixel circuits (e.g., a first additional pixel circuit PCs1 of FIG. 4) arranged in the intermediate area MA are used for driving the additional display elements EDs1-1 and EDs1-2 of the component area CA, so that the number of auxiliary display elements disposed per unit area in the intermediate area MA may be less than the number of display elements, for example, main display elements EDm, disposed per unit area in the main display area MDA.

Each of the main display elements EDm, the $1^{st}$-$1^{st}$ auxiliary display element EDa1-1 and the additional display elements EDs1-1 and EDs1-2 may be a pixel included in the display apparatus 1. That is, the main display elements EDm are main pixels in the main display area MDA, the $1^{st}$-$1^{st}$ auxiliary display element EDa1-1 may be an auxiliary pixel in the intermediate area MA, and the additional display elements EDs1-1 and EDs1-2 may be additional pixels in the component area CA.

Hereinafter, an organic light emitting display device will be exemplified as the display apparatus 1 according to an embodiment, but the display apparatus of the disclosure is not limited thereto. For example, the display apparatus 1 of the disclosure may be an inorganic light-emitting display device (or an inorganic EL display device) or a quantum dot light-emitting display. For example, an emission layer of a display element included in the display apparatus 1 may include an organic material, an inorganic material, or an organic material and quantum dots. In addition, the display apparatus 1 may include quantum dots to convert the wavelength of light.

Figure 4:
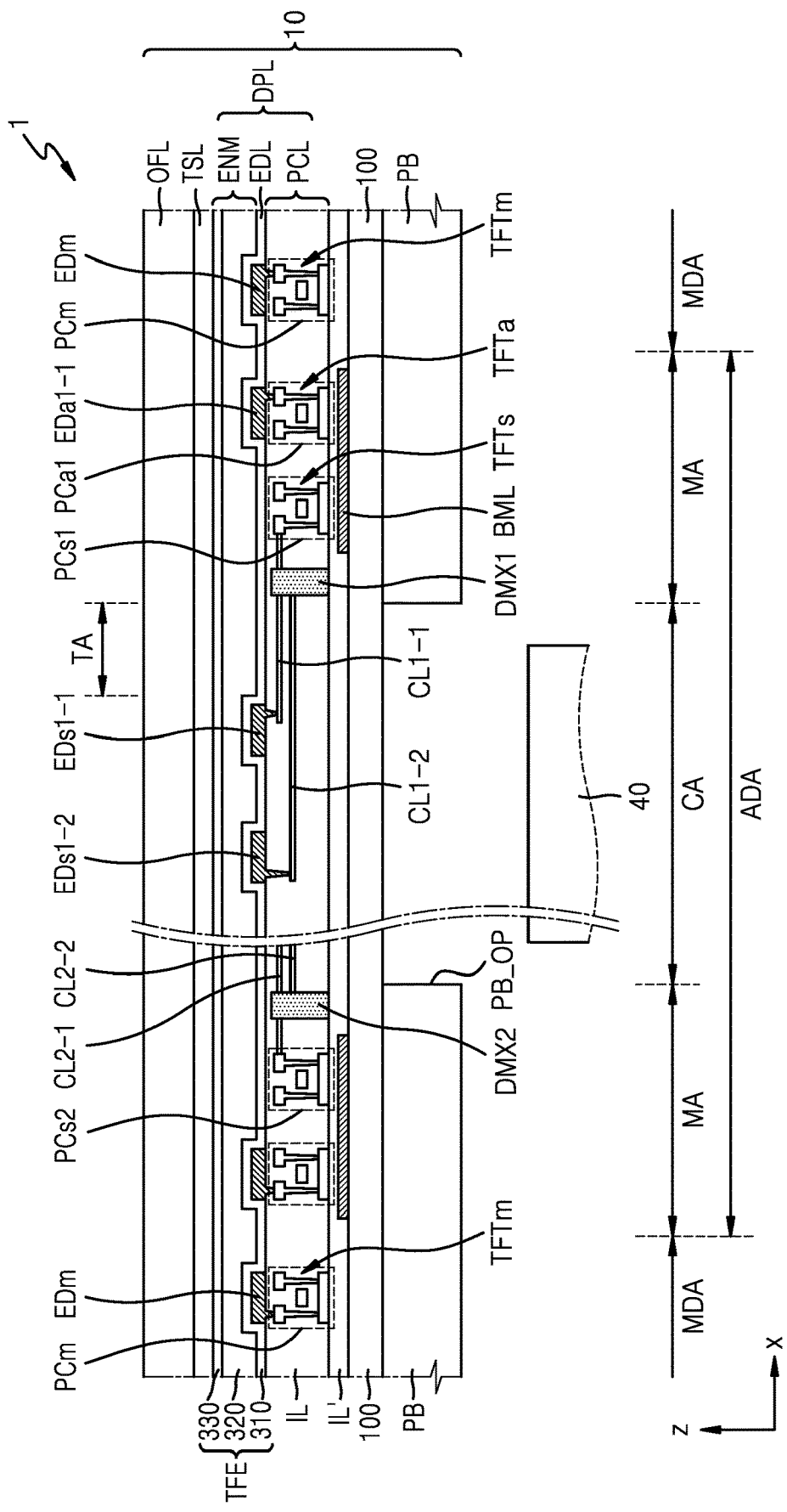
FIG. 4 is a cross-sectional view schematically illustrating a portion of a cross-section of a display apparatus according to an embodiment.

FIG. 4 is a cross-sectional view schematically illustrating a portion of a cross-section of a display apparatus 1 according to an embodiment.

As shown in FIG. 4, the display apparatus 1 may include a display panel 10 and the component 40 disposed to overlap the display panel 10. A cover window (not shown) for protecting the display panel 10 may be disposed on the display panel 10.

The display panel 10 may include the auxiliary display area ADA in which an auxiliary image is displayed and the main display area MDA in which a main image is displayed. The auxiliary display area ADA may include the component area CA that is an area overlapping the component 40 and the intermediate area MA surrounding the component area CA.

The display panel 10 may include a substrate 100, a display layer DPL disposed on the substrate 100, a touch screen layer TSL, an optical functional layer OFL, and a panel protection layer PB disposed under the substrate 100.

The display layer DPL may include a circuit layer PCL including thin-film transistors TFTm, TFTa, and TFTs, a display element layer EDL including display elements EDm, EDa1-1, EDs1-1, and EDs1-2 that are light-emitting elements, and a sealing layer ENM including a thin-film encapsulation layer TFE. The sealing layer ENM may include a sealing substrate (not shown) other than the thin-film encapsulation layer TFE. Insulating layers IL and IL' may be disposed between the substrate 100 and the display layer DPL and within the display layer DPL. Each of the display elements EDm, EDa1-1, EDs1-1, and EDs1-2 may be an organic light-emitting diode (OLED).

The substrate 100 may include glass, metal, or a polymer resin. When the display panel 10 is flexible or bendable, the substrate 100 may include, for example, a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. In addition, the substrate 100 may have a multilayer structure including two layers including the polymer resin, and a barrier layer including an inorganic material (such as silicon oxide, silicon nitride, silicon oxynitride, etc.) between the two layers, and various modifications thereof may be made.

The main display area MDA of the display panel 10 may include the main display element EDm and a main pixel circuit PCm connected thereto. The main pixel circuit PCm may include at least one thin-film transistor TFTm configured to control light emitting time or intensity of the main display element EDm.

The intermediate area MA of the display panel 10 may include the $1^{st}$-$1^{st}$ auxiliary display element EDa1-1 and a first auxiliary pixel circuit PCa1 connected thereto. The first auxiliary pixel circuit PCa1 may include at least one thin-film transistor TFTa configured to control light emitting time or intensity of the $1^{st}$-$1^{st}$ auxiliary display element EDa1-1.

The $1^{st}$-$1^{st}$ additional display element EDs1-1 and the $1^{st}$-$2^{nd}$ additional display element EDs1-2 are arranged in the component area CA of the display panel 10. However, the first additional pixel circuit PCs1 including at least one thin-film transistor TFTs configured to control light emitting time or intensity of the $1^{st}$-$1^{st}$ additional display element EDs1-1 and the $1^{st}$-$2^{nd}$ additional display element EDs1-2 may be arranged in the intermediate area MA instead of the component area CA. A first separation circuit DMX1 in the intermediate area MA has a first input terminal, a $1^{st}$-$1^{st}$ output terminal, and a $1^{st}$-$2^{nd}$ output terminal, wherein the first additional pixel circuit PCs1 is electrically connected to the first input terminal of the first separation circuit DMX1, a $1^{st}$-$1^{st}$ output terminal of the first separation circuit DMX1 is electrically connected to the $1^{st}$-$1^{st}$ additional display element EDs1-1 through a $1^{st}$-$1^{st}$ connection wire CL1-1, and a $1^{st}$-$2^{nd}$ output terminal of the first separation circuit DMX1 is electrically connected to the $1^{st}$-$2^{nd}$ additional display element EDs1-2 through a $1^{st}$-$2^{nd}$ connection wire CL1-2. Although it is illustrated in FIG. 4 that the $1^{st}$-$1^{st}$ connection wire CL1-1 and the $1^{st}$-$2^{nd}$ connection wire CL1-2 are disposed on different layers, this is only for convenience of illustration. That is, the $1^{st}$-$1^{st}$ connection wire CL1-1 and the $1^{st}$-$2^{nd}$ connection wire CL1-2 may be disposed on the same layer so as not to cross each other. The $1^{st}$-$1^{st}$ connection wire CL1-1 and the $1^{st}$-$2^{nd}$ connection wire CL1-2 may include a transparent conductive material.

An area in the component area CA in which the $1^{st}$-$1^{st}$ additional display element EDs1-1 and the $1^{st}$-$2^{nd}$ additional display element EDs1-2 are not disposed may be defined as the transmission area TA. The transmission area TA may be an area through which light/signal emitted from the component 40 disposed to correspond to the component area CA or light/signal incident to the component 40 is transmitted.

The $1^{st}$-$1^{st}$ connection wire CL1-1 electrically connecting the $1^{st}$-$1^{st}$ output terminal of the first separation circuit DMX1 to the $1^{st}$-$1^{st}$ additional display element EDs1-1, and the $1^{st}$-$2^{nd}$ connection wire CL1-2 electrically connecting the $1^{st}$-$2^{nd}$ output terminal of the first separation circuit DMX1 to the $1^{st}$-$2^{nd}$ additional display element EDs1-2 may traverse the transmission area TA. Because the $1^{st}$-$1^{st}$ connection wire CL1-1 and the $1^{st}$-$2^{nd}$ connection wire CL1-2 may include a transparent conductive material having high transmittance, even if the $1^{st}$-$1^{st}$ connection wire CL1-1 and the $1^{st}$-$2^{nd}$ connection wire CL1-2 are arranged in the transmission area TA, the transmission area TA may secure sufficient transmittance. In the case of the display apparatus 1 according to the present embodiment as described above, because the first additional pixel circuit PCs1 is not disposed in the component area CA, the area of the transmission area TA may be easily expanded and light transmittance in the transmission area TA may be further increased.

The display element layer EDL may be covered with the thin-film encapsulation layer TFE or an encapsulation substrate as shown in FIG. 4. In an embodiment, the thin-film encapsulation layer TFE may include at least one inorganic encapsulation layer and at least one organic encapsulation layer as shown in FIG. 4. For example, the thin-film encapsulation layer TFE may include a first inorganic encapsulation layer 310 and a second inorganic encapsulation layer 330, and an organic encapsulation layer 320 disposed therebetween.

The first inorganic encapsulation layer 310 and the second inorganic encapsulation layer 330 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$, $ZnO_x$ may be ZnO or $ZnO_2$), and may be formed by chemical vapor deposition (CVD) or the like. The organic encapsulation layer 320 may include a polymer-based material. Examples of the polymer-based material may include silicone resin, acrylic resin (e.g., polymethyl methacrylate, polyacrylic acid, etc.), epoxy resin, polyimide, polyethylene, or the like.

Each of the first inorganic encapsulation layer 310, the organic encapsulation layer 320, and the second inorganic encapsulation layer 330 may be integrally formed to cover the main display area MDA and the auxiliary display area ADA.

The touch screen layer TSL may obtain coordinate information according to an external input, for example, a touch event. The touch screen layer TSL may include a touch electrode and touch wires connected to the touch electrode. The touch screen layer TSL may sense an external input using a self-capacitance method or a mutual capacitance method.

The touch screen layer TSL may be formed on the thin-film encapsulation layer TFE. Alternatively, the touch screen layer TSL may be separately formed on a touch substrate and then disposed on the thin-film encapsulation layer TFE through an adhesive layer such as an optically clear adhesive (OCA). In an embodiment, the touch screen layer TSL may be formed directly on the thin-film encapsulation layer TFE, and in this case, the adhesive layer may not be interposed between the touch screen layer TSL and the thin-film encapsulation layer TFE.

The optical functional layer OFL may include an anti-reflection layer. The anti-reflection layer may reduce the reflectance of light (external light) incident toward the display apparatus 1 from the outside. In an embodiment, the optical functional layer OFL may be a polarizer film. If necessary, the optical functional layer OFL may have an opening (not shown) corresponding to the transmission area TA so that light transmittance of the transmission area TA may be increased. The opening may be filled with a transparent material such as an optically clear resin (OCR). As needed, the optical functional layer OFL may be a filter plate including a black matrix and color filters.

The panel protection layer PB may be attached to a lower portion of the substrate 100 to support and protect the substrate 100. The panel protection layer PB may have an opening PB_OP corresponding to the component area CA. By allowing the panel protection layer PB to have the opening PB_OP, the light transmittance of the component area CA may be improved. The panel protection layer PB may include polyethyleneterephthalate or polyimide.

An area of the component area CA may be greater than an area in which the component 40 is disposed. Accordingly, an area of the opening PB_OP provided in the panel protection layer PB may not match the area of the component area CA. In FIG. 4, although the component 40 is illustrated as being apart from the display panel 10, at least a portion of the component 40 may be inserted into the opening PB_OP provided in the panel protection layer PB.

If necessary, a plurality of components 40 may be arranged in the component area CA. In this case, the components 40 may have different functions from each other. For example, the components 40 may include at least two of a camera (imaging device), a solar cell, a flash, a proximity sensor, an illuminance sensor, and an iris sensor.

On the other hand, as shown in FIG. 4, a bottom metal layer BML may be disposed under the first auxiliary pixel circuit PCa1 and the first additional pixel circuit PCs1 in the intermediate area MA. The bottom metal layer BML may be disposed to overlap pixel circuits to protect the pixel circuits. For example, the bottom metal layer BML in the intermediate area MA may be disposed to overlap the first auxiliary pixel circuit PCa1 and the first additional pixel circuit PCs1 between the first auxiliary pixel circuit PCa1 and the first additional pixel circuit PCs1 and the substrate 100. The bottom metal layer BML may prevent or minimize external light from reaching and affecting the first auxiliary pixel circuit PCa1 and the first additional pixel circuit PCs1. If necessary, the bottom metal layer BML may be formed to correspond to the entire display area DA, and may include a lower hole corresponding to the component area CA. However, the display apparatus 1 may not have the bottom metal layer BML.

Figure 5:
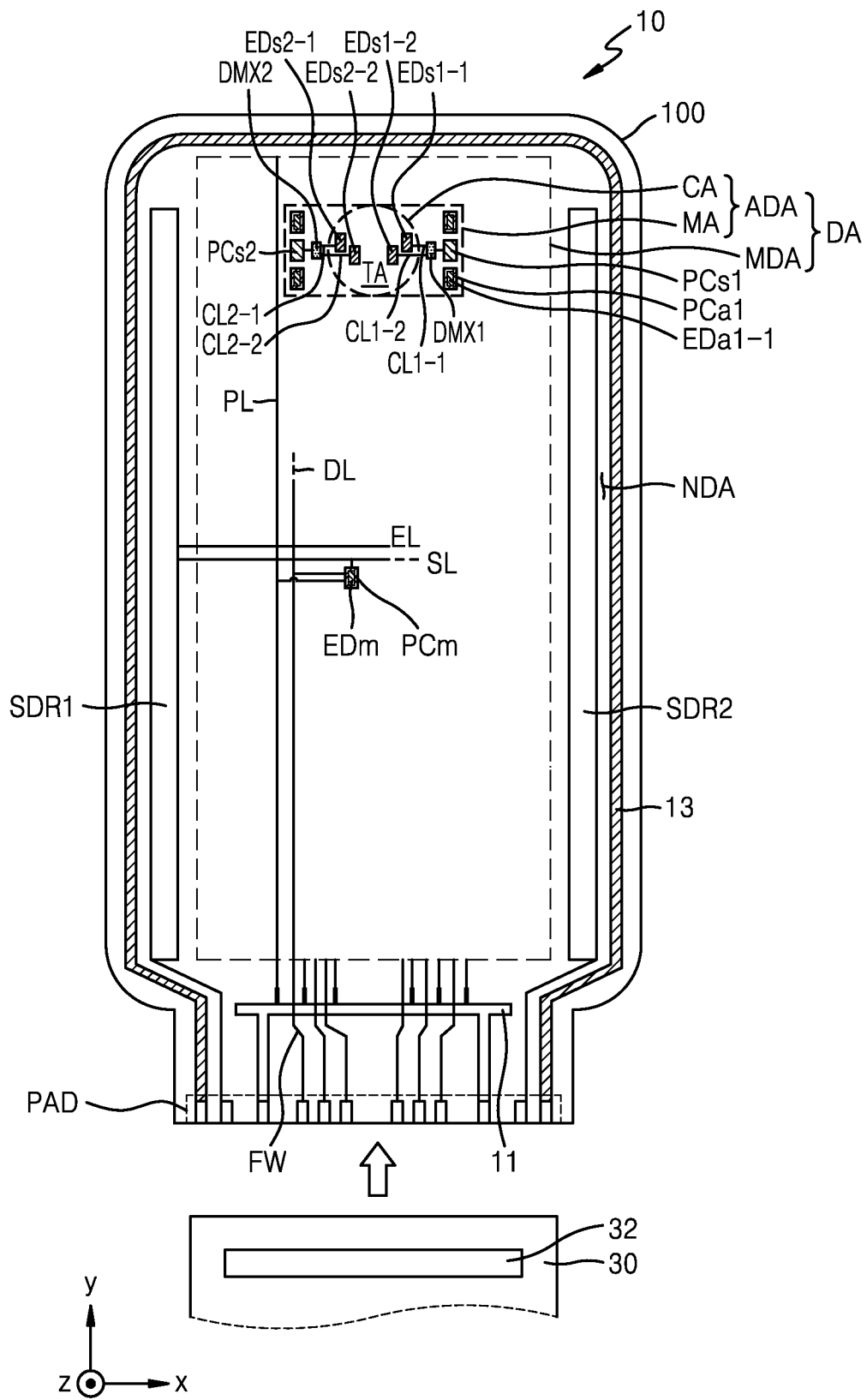
FIG. 5 is a plan view schematically illustrating a display panel that may be included in the display apparatus of FIG. 1.

FIG. 5 is a plan view schematically illustrating the display panel 10 that may be included in the display apparatus 1 of FIG. 1.

The plurality of main display elements EDm are arranged in the main display area MDA. Each of the main display elements EDm is electrically connected to a corresponding main pixel circuit PCm. The main display elements EDm may be disposed to overlap the corresponding main pixel circuit PCm. The main display element EDm may emit, for example, red, green, blue, or white light. The main display area MDA may be covered with a sealing layer ENM (see FIG. 4) to be protected from external air or moisture.

In the auxiliary display area ADA surrounded by the main display area MDA, the $1^{st}$-$1^{st}$ auxiliary display element EDa1-1, the $1^{st}$-$1^{st}$ additional display element EDs1-1, and the $1^{st}$-$2^{nd}$ additional display element EDs1-2 are provided. The $1^{st}$-$1^{st}$ auxiliary display element EDa1-1, the $1^{st}$-$1^{st}$ additional display element EDs1-1, and the $1^{st}$-$2^{nd}$ additional display element EDs1-2 may emit, for example, red, green, blue, or white light. The auxiliary display area ADA may be covered with a sealing layer ENM (see FIG. 4) to be protected from external air or moisture.

The auxiliary display area ADA may include the component area CA and the intermediate area MA surrounding the component area CA. The $1^{st}$-$1^{st}$ auxiliary display element EDa1-1 may be arranged in the intermediate area MA, and the $1^{st}$-$1^{st}$ additional display element EDs1-1 and the $1^{st}$-$2^{nd}$ additional display element EDs1-2 may be arranged in the component area CA.

The $1^{st}$-$1^{st}$ auxiliary display element EDa1-1 is electrically connected to the first auxiliary pixel circuit PCa1 controlling the $1^{st}$-$1^{st}$ auxiliary display element EDa1-1, and the $1^{st}$-$1^{st}$ additional display element EDs1-1 and the $1^{st}$-$2^{nd}$ additional display element EDs1-2 are electrically connected to the first additional pixel circuit PCs' controlling the $1^{st}$-$1^{st}$ additional display element EDs1-1 and the $1^{st}$-$2^{nd}$ additional display element EDs1-2 through the first separation circuit DMX1. The first auxiliary pixel circuit PCa1, the first additional pixel circuit PCs1, and the first separation circuit DMX1 may all be arranged in the intermediate area MA. Accordingly, the $1^{st}$-$1^{st}$ additional display element EDs1-1 and the $1^{st}$-$2^{nd}$ additional display element EDs1-2 and the first separation circuit DMX1 may be connected to each other by the $1^{st}$-$1^{st}$ connection wire CL1-1 and the $1^{st}$-$2^{nd}$ connection wire CL1-2. The first auxiliary pixel circuit PCa1 and the $1^{st}$-$1^{st}$ auxiliary display element EDa1-1 may be disposed to overlap each other.

As described above, the component area CA may have the transmission area TA. As such, because the component area CA has the transmission area TA, the resolution of the component area CA may be lower than that of the main display area MDA. For example, the resolution of the component area CA may be about ½, ⅜, ⅓, ¼, 2/9, ⅛, 1/9, 1/16, etc. of the resolution of the main display area MDA. For example, the resolution of the main display area MDA may be about 400 ppi or more, and the resolution of the component area CA may be about 200 ppi or about 100 ppi.

Each of the pixel circuits PCm, PCa1, and PCs1 of the display area DA may be electrically connected to external circuits arranged in the peripheral area NDA. A first scan driving circuit SDR1, a second scan driving circuit SDR2, a terminal PAD, a driving voltage supply line 11, and a common voltage supply line 13 may be arranged in the peripheral area NDA.

The first scan driving circuit SDR1 may be disposed on one side (a −x direction) of the display area DA. The second scan driving circuit SDR2 may be symmetrically disposed with the first scan driving circuit SDR1 with respect to the main display area MDA. The first scan driving circuit SDR1 may be connected to some of the main pixel circuits PCm through a scan line SL to apply a scan signal. The second scan driving circuit SDR2 may be connected to the remaining of the main pixel circuits PCm through a scan line (not shown) to apply a scan signal. The first scan driving circuit SDR1 may be connected to some of the main pixel circuits PCm through an emission control line EL to apply an emission control signal. The second scan driving circuit SDR2 may be connected to the remaining of the main pixel circuits PCm through an emission control line (not shown) to apply an emission control signal. However, the first scan driving circuit SDR1 or the second scan driving circuit SDR2 may apply a scan signal to the first auxiliary pixel circuit PCa1 and the first additional pixel circuit PCs1.

The terminal PAD may be disposed on one side of the substrate 100. The terminal PAD may be exposed without being covered by an insulating layer to be connected to a display circuit board 30. A display driver 32 may be arranged on the display circuit board 30.

The display driver 32 may generate a control signal transmitted to the first scan driving circuit SDR1 and the second scan driving circuit SDR2. In addition, the display driver 32 may generate a data signal, and the generated data signal may be transmitted to the main pixel circuit PCm, the first auxiliary pixel circuit PCa1, and the first additional pixel circuit PCs1 through a fan-out wire FW and a data line DL connected to the fan-out wire FW.

The display driver 32 may supply a driving voltage ELVDD (see FIG. 7) to the driving voltage supply line 11 and may supply a common voltage ELVSS (see FIG. 7) to the common voltage supply line 13. The driving voltage ELVDD may be applied to the main pixel circuit PCm, the first auxiliary pixel circuit PCa1, and the first additional pixel circuit PCs1 through a driving voltage line PL connected to the driving voltage supply line 11, and the common voltage ELVSS may be connected to the common voltage supply line 13 to be applied to an opposite electrode which is a common electrode through the main display element EDm, the $1^{st}$-$1^{st}$ auxiliary display element EDa1-1, the $1^{st}$-$1^{st}$ additional display element EDs1-1, and the $1^{st}$-$2^{nd}$ additional display element EDs1-2.

The driving voltage supply line 11 may be provided to extend in an x-direction from a lower side of the main display area MDA. The common voltage supply line 13 has a loop shape with one side open, and may partially surround the main display area MDA.

Figure 6:
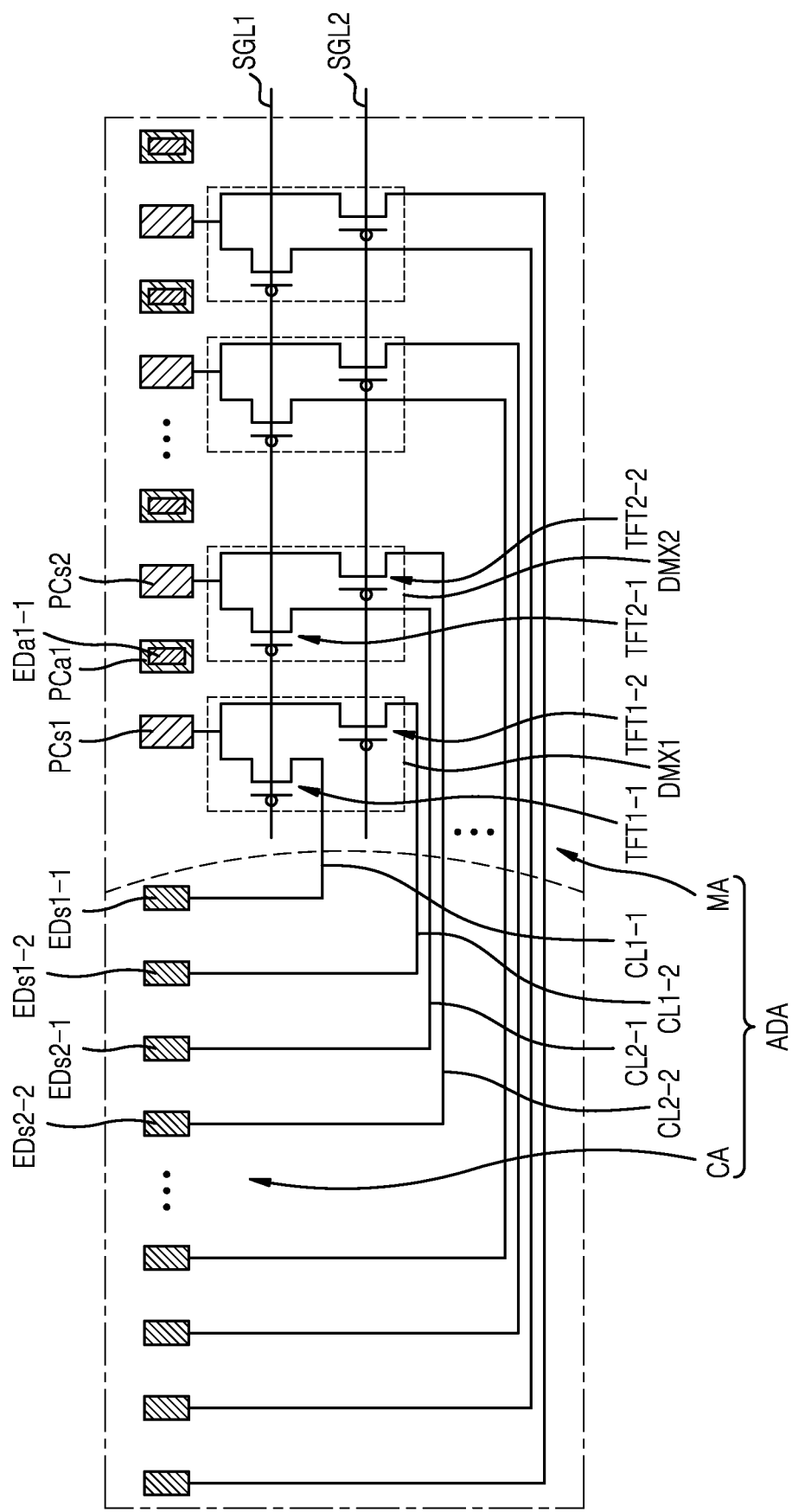
FIG. 6 is a conceptual diagram schematically illustrating a portion of the display panel of FIG. 5.

FIG. 6 is a conceptual diagram schematically illustrating a portion of the display panel 10 of FIG. 5.

As described above, the $1^{st}$-$1^{st}$ auxiliary display element EDa1-1, the first auxiliary pixel circuit PCa1, the first additional pixel circuit PCs1, and the first separation circuit DMX1 may all be arranged in the intermediate area MA. In addition, the $1^{st}$-$1^{st}$ additional display element EDs1-1 and the $1^{st}$-$2^{nd}$ additional display element EDs1-2 may be arranged in the component area CA, and the $1^{st}$-$1^{st}$ additional display element EDs1-1 and the $1^{st}$-$2^{nd}$ additional display element EDs1-2 and the first separation circuit DMX1 may be connected to each other by the $1^{st}$-$1^{st}$ connection wire CL1-1 and the $1^{st}$-$2^{nd}$ connection wire CL1-2.

If the $1^{st}$-$1^{st}$ additional display element EDs1-1 in the component area CA is connected to a corresponding pixel circuit, and the $1^{st}$-$2^{nd}$ additional display element EDs1-2 is connected to another corresponding pixel circuit, each of the one pixel circuit and the other pixel circuit should be in the intermediate area MA. However, in the case of the display apparatus 1 according to the present embodiment, the $1^{st}$-$1^{st}$ additional display element EDs1-1 and the $1^{st}$-$2^{nd}$ additional display element EDs1-2 are controlled by one first additional pixel circuit PCs' through the first separation circuit DMX1. Accordingly, the number of additional pixel circuits arranged in the intermediate area MA may be remarkably reduced, and thus, a higher-resolution image may be displayed in the intermediate area MA through the $1^{st}$-$1^{st}$ auxiliary display element EDa1-1. Because the configuration of the first separation circuit DMX1 is simpler than that of the additional pixel circuit, an area occupied by the first separation circuit DMX1 in the intermediate area MA is much smaller than an area occupied by one additional pixel circuit.

As shown in FIG. 6, the display apparatus 1 according to the present embodiment may further include a second additional pixel circuit PCs2, a second separation circuit DMX2 having a second input terminal, a $2^{nd}$-$1^{st}$ output terminal, and a $2^{nd}$-$2^{nd}$ output terminal, a $2^{nd}$-$1^{st}$ additional display element EDs2-1, and a $2^{nd}$-$2^{nd}$ additional display element EDs2-2. The second additional pixel circuit PCs2 and the second separation circuit DMX2 may be arranged in the intermediate area MA, and the second input terminal of the second additional pixel circuit PCs2 may be electrically connected to the second separation circuit DMX2. In addition, the $2^{nd}$-$1^{st}$ additional display element EDs2-1 and the $2^{nd}$-$2^{nd}$ additional display element EDs2-2 may be arranged in the component area CA, the $2^{nd}$-$1^{st}$ additional display element EDs2-1 may be connected to the $2^{nd}$-$1^{st}$ output terminal of the second separation circuit DMX2 by a $2^{nd}$-$1^{st}$ connection wire CL2-1, and the $2^{nd}$-$2^{nd}$ additional display element EDs2-2 may be connected to the $2^{nd}$-$2^{nd}$ output terminal of the second separation circuit DMX2 by a $2^{nd}$-$2^{nd}$ connection wire CL2-2. Accordingly, the $2^{nd}$-$1^{st}$ additional display element EDs2-1 and the $2^{nd}$-$2^{nd}$ additional display element EDs2-2 may be controlled through the second additional pixel circuit PCs2.

The first separation circuit DMX1, as shown in FIG. 6, may include a $1^{st}$-$1^{st}$ transistor TFT1-1 connecting a first input terminal to a $1^{st}$-$1^{st}$ output terminal and a $1^{st}$-$2^{nd}$ transistor TFT1-2 connecting the first input terminal to a $1^{st}$-$2^{nd}$ output terminal. Similarly, the second separation circuit DMX2 may include a $2^{nd}$-$1^{st}$ transistor TFT2-1 connecting the second input terminal to the $2^{nd}$-$1^{st}$ output terminal, and a $2^{nd}$-$2^{nd}$ transistor TFT2-2 connecting the second input terminal to the $2^{nd}$-$2^{nd}$ output terminal. As described above, because the first separation circuit DMX1 and the second separation circuit DMX2 have a simpler configuration than that of an additional pixel circuit to be described later, the area of each of the first separation circuit DMX1 and the second separation circuit DMX2 may be less than that of the additional pixel circuit.

A gate electrode of the $1^{st}$-$1^{st}$ transistor TFT1-1 of the first separation circuit DMX1 and a gate electrode of the $2^{nd}$-$1^{st}$ transistor TFT2-1 of the second separation circuit DMX2 may be electrically connected to a first signal line SGL1. In addition, a gate electrode of the $1^{st}$-$2^{nd}$ transistor TFT1-2 of the first separation circuit DMX1 and a gate electrode of the $2^{nd}$-$2^{nd}$ transistor TFT2-2 of the second separation circuit DMX2 may be electrically connected to a second signal line SGL2. Accordingly, operation of the $1^{st}$-$1^{st}$ transistor TFT1-1 of the first separation circuit DMX1 and the $2^{nd}$-$1^{st}$ transistor TFT2-1 of the second separation circuit DMX2 may be controlled through the first signal line SGL1, and operation of the $1^{st}$-$2^{nd}$ transistor TFT1-2 of the first separation circuit DMX1 and the $2^{nd}$-$2^{nd}$ transistor TFT2-2 of the second separation circuit DMX2 may be controlled through the second signal line SGL2.

That is, when the $1^{st}$-$1^{st}$ transistor TFT1-1 and the $2^{nd}$-$1^{st}$ transistor TFT2-1 are turned on through the first signal line SGL1, the $1^{st}$-$2^{nd}$ transistor TFT1-2 and the $2^{nd}$-$2^{nd}$ transistor TFT2-2 may be turned off through the second signal line SGL2. When the $1^{st}$-$1^{st}$ transistor TFT1-1 and the $2^{nd}$-$1^{st}$ transistor TFT2-1 are turned off through the first signal line SGL1, the $1^{st}$-$2^{nd}$ transistor TFT1-2 and the $2^{nd}$-$2^{nd}$ transistor TFT2-2 may be turned on through the second signal line SGL2. Accordingly, when the $1^{st}$-$1^{st}$ transistor TFT1-1 and the $2^{nd}$-$1^{st}$ transistor TFT2-1 are turned on through the first signal line SGL1, the first additional pixel circuit PCs' may control the $1^{st}$-$1^{st}$ additional display element EDs1-1, and the second additional pixel circuit PCs2 may control the $2^{nd}$-$1^{st}$ additional display element EDs2-1. When the $1^{st}$-$2^{nd}$ transistor TFT1-2 and the $2^{nd}$-$2^{nd}$ transistor TFT2-2 are turned on through the second signal line SGL2, the first additional pixel circuit PCs1 may control the $1^{st}$-$2^{nd}$ additional display element EDs1-2, and the second additional pixel circuit PCs2 may control the $2^{nd}$-$2^{nd}$ additional display element EDs2-2.

While the first additional pixel circuit PCs1 controls the $1^{st}$-$1^{st}$ additional display element EDs1-1 and the $1^{st}$-$2^{nd}$ additional display element EDs1-2, the first auxiliary pixel circuit PCa1 may control the $1^{st}$-$1^{st}$ auxiliary display element EDa1-1. In addition, the first signal line SGL1 and the second signal line SGL2 may receive a selection signal from a separation circuit and a driving circuit in the peripheral area NDA.

Figure 7:
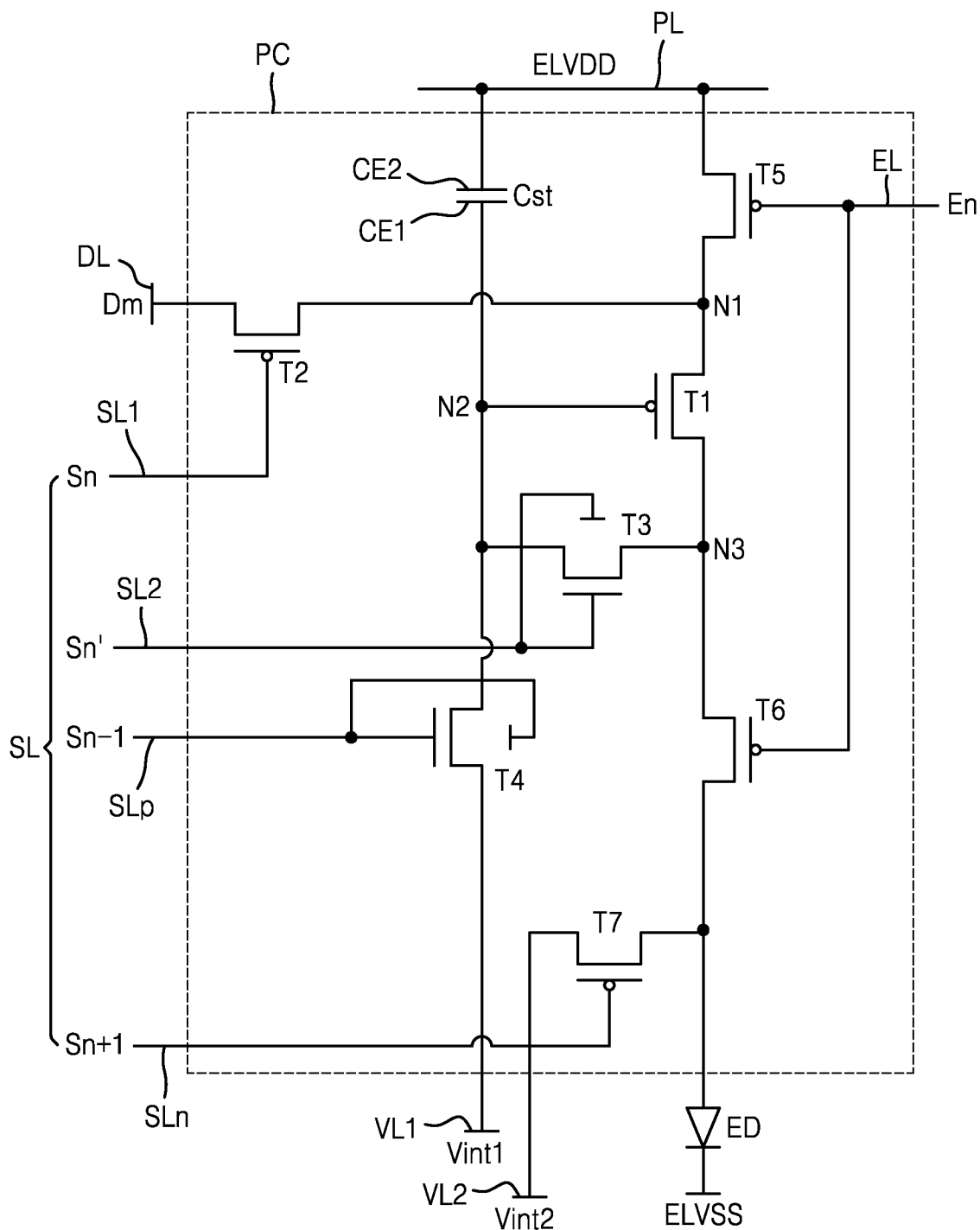
FIG. 7 is an equivalent circuit diagram of one pixel included in the display apparatus of FIG. 1.

FIG. 7 is an equivalent circuit diagram of one pixel included in the display apparatus 1 of FIG. 1. Because the equivalent circuit diagram of FIG. 7 includes a pixel circuit PC and a display element ED electrically connected thereto, the pixel circuit PC of FIG. 7 may correspond to the main pixel circuit PCm or the first auxiliary pixel circuit PCa1 shown in FIG. 5 or the like, and the display element ED of FIG. 7 may correspond to the main display element EDm or the $1^{st}$-$1^{st}$ auxiliary display element EDa1-1 shown in FIG. 5 or the like.

The pixel circuit PC may include a plurality of thin-film transistors T1 to T7 and a storage capacitor Cst as shown in FIG. 7. The plurality of thin-film transistors T1 to T7 and the storage capacitor Cst may be connected to signal lines SL1, SL2, SLp, SLn, EL, and DL, a first initialization voltage line VL1, a second initialization voltage line VL2, and the driving voltage line PL. At least one of these wires, for example, the driving voltage line PL may be shared by neighboring pixels P.

The plurality of thin-film transistors T1 to T7 may include the driving transistor T1, the switching transistor T2, the compensation transistor T3, the first initialization transistor T4, the operation control transistor T5, the emission control transistor T6, and the second initialization transistor T7.

The display element ED may be an organic light emitting diode, and in this case, the organic light emitting diode may include a pixel electrode and an opposite electrode. The pixel electrode of the organic light emitting diode may be connected to the driving transistor T1 via the emission control transistor T6 to receive a driving current, and the opposite electrode may receive the common voltage ELVSS. The organic light emitting diode may generate light having a luminance corresponding to the driving current.

Some of the plurality of thin-film transistors T1 to T7 may be an n-channel MOSFET (NMOS), and the remaining may be a p-channel MOSFET (PMOS). For example, among the plurality of thin-film transistors T1 to T7, the compensation transistor T3 and the first initialization transistor T4 may be NMOS, and the remaining may be PMOS. Alternatively, among the plurality of thin-film transistors T1 to T7, the compensation transistor T3, the first initialization transistor T4, and the second initialization transistor T7 may be NMOS, and the remaining may be PMOS. Alternatively, all of the plurality of thin-film transistors T1 to T7 may be NMOS or PMOS. The plurality of thin-film transistors T1 to T7 may include amorphous silicon or polysilicon. If necessary, an NMOS thin-film transistor may include an oxide semiconductor. Hereinafter, for convenience, a case in which the compensation transistor T3 and the first initialization transistor T4 are NMOS including an oxide semiconductor, and the rest are PMOS will be described.

A signal line may include a first scan line SL1 transmitting a first scan signal Sn, a second scan line SL2 transmitting a second scan signal Sn', a previous scan line SLp transmitting a previous scan signal Sn−1 to the first initialization transistor T4, a subsequent scan line SLn transmitting a subsequent scan signal Sn+1 to the second initialization transistor T7, an emission control line EL transmitting an emission control signal En to the operation control transistor T5 and the emission control transistor T6, and the data line DL crossing the first scan line SL1 and transmitting a data signal Dm.

The driving voltage line PL may transmit the driving voltage ELVDD to the driving transistor T1, the first initialization voltage line VL1 may transmit a first initialization voltage Vint1 initializing the driving transistor T1, and the second initialization voltage line VL2 may transmit a second initialization voltage Vint2 initializing a pixel electrode of an organic light-emitting diode OLED.

A driving gate electrode of the driving transistor T1 may be connected to the storage capacitor Cst through a second node N2, any one of a source area and a drain area of the driving transistor T1 may be connected to the driving voltage line PL via the operation control transistor T5 through a first node N1, and the other of the source area and the drain area of the driving transistor T1 may be electrically connected to the pixel electrode of the organic light emitting diode OLED via the emission control transistor T6 through a third node N3. The driving transistor T1 may receive the data signal Dm according to a switching operation of the switching transistor T2 to supply a driving current to the organic light emitting diode OLED. That is, in response to a voltage applied to the second node N2 that is changed by the data signal Dm, the driving transistor T1 may control the amount of current flowing from the first node N1 electrically connected to the driving voltage line PL to the organic light emitting diode OLED.

A switching gate electrode of the switching transistor T2 may be connected to the first scan line SL1 transmitting the first scan signal Sn, any one of a source area and a drain area of the switching transistor T2 may be connected to the data line DL, and the other of the source area and the drain area of the switching transistor T2 may be connected to the driving transistor T1 through the first node N1 and connected to the driving voltage line PL via the operation control transistor T5. The switching transistor T2 may transmit the data signal Dm from the data line DL to the first node N1 in response to a voltage applied to the first scan line SL1. That is, the switching transistor T2 may be turned on in response to the first scan signal Sn received through the first scan line SL1 to transmit the data signal Dm supplied from the data line DL to the driving transistor T1 through the first node N1.

A compensation gate electrode of the compensation transistor T3 is connected to the second scan line SL2. Any one of a source area and a drain area of the compensation transistor T3 may be connected to the pixel electrode of the organic light emitting diode via the emission control transistor T6 through the third node N3. The other of the source area and the drain area of the compensation transistor T3 may be connected to a first capacitor electrode CE1 of the storage capacitor Cst and the driving gate electrode of the driving transistor T1 through the second node N2. The compensation transistor T3 may be turned on in response to the second scan signal Sn' received through the second scan line SL2 to diode-connect the driving transistor T1.

A first initialization gate electrode of the first initialization transistor T4 may be connected to the previous scan line SLp. Any one of a source area and a drain area of the first initialization transistor T4 may be connected to the first initialization voltage line VL1. The other of the source area and the drain area of the first initialization transistor T4 may be connected to the first capacitor electrode CE1 of the storage capacitor Cst and the driving gate electrode of the driving transistor T1 through the second node N2. The first initialization transistor T4, in response to a voltage applied to the previous scan line SLp, may apply the first initialization voltage Vint1 from the first initialization voltage line VL1 to the second node N2. That is, the first initialization transistor T4 may be turned on in response to the previous scan signal Sn−1 received through the previous scan line SLp to transmit the first initialization voltage Vint1 to the driving gate electrode of the driving transistor T1 to perform an initialization operation for initializing a voltage of the driving gate electrode of the driving transistor T1.

An operation control gate electrode of the operation control transistor T5 may be connected to the emission control line EL, any one of a source area and a drain area of the operation control transistor T5 may be connected to the driving voltage line PL, and the other may be connected to the driving transistor T1 and switching transistor T2 through the first node N1.

An emission control gate electrode of the emission control transistor T6 may be connected to the emission control line EL, any one of a source area and a drain area of the emission control transistor T6 may be connected to the driving transistor T1 and the compensation transistor T3 through the third node N3, and the other of the source area and the drain area of the emission control transistor T6 may be electrically connected to the pixel electrode of the organic light emitting diode.

The operation control transistor T5 and the emission control transistor T6 are simultaneously turned on in response to the emission control signal En received through the emission control line EL, and the driving voltage ELVDD is transmitted to the organic light emitting diode so that a driving current flows through the organic light emitting diode.

A second initialization gate electrode of the second initialization transistor T7 may be connected to the subsequent scan line SLn, any one of a source area and a drain area of the second initialization transistor T7 may be connected to the pixel electrode of the organic light emitting diode, and the other of the source area and the drain area of the second initialization transistor T7 may be connected to the second initialization voltage line VL2 to receive the second initialization voltage Vint2. The second initialization transistor T7 is turned on in response to the subsequent scan signal Sn+1 through the subsequent scan line SLn and thus initialize the pixel electrode of the organic light emitting diode. The subsequent scan line SLn may be a first scan line electrically connected to a pixel which is electrically connected to the data line DL and is adjacent to the pixel illustrated in FIG. 7. Thus, a scan line may function as the first scan line SL1 and the subsequent scan line SLn by transmitting scan signals at different time.

The second initialization transistor T7 may be connected to the subsequent scan line SLn as shown in FIG. 7. However, the disclosure is not limited thereto, and the second initialization transistor T7 may be connected to the emission control line EL and driven according to the emission control signal En.

The storage capacitor Cst may include a first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store a charge corresponding to a difference between the driving gate electrode voltage of the driving transistor T1 and the driving voltage ELVDD.

A specific operation of each pixel circuit PC according to an embodiment is as follows.

During an initialization period, when the previous scan signal Sn−1 is supplied through the previous scan line SLp, the first initialization transistor T4 is turned on in response to the previous scan signal Sn−1, and the driving transistor T1 is initialized by the first initialization voltage Vint1 supplied from the first initialization voltage line VL1.

During a data programming period, when the first scan signal Sn and the second scan signal Sn' are supplied through the first scan line SL1 and the second scan line SL2, the switching transistor T2 and the compensation transistor T3 are turned on in response to the first scan signal Sn and the second scan signal Sn'. At this time, the driving transistor T1 is diode-connected by the turned-on compensation transistor T3 and is forward biased. Then, a compensation voltage (Dm+Vth, where Vth is (−) value), which is reduced by a threshold voltage Vth of the driving transistor T1 from the data signal Dm supplied from the data line DL, is applied to the driving gate electrode of the driving transistor T1. The driving voltage ELVDD and the compensation voltage Dm+Vth are applied to both ends of the storage capacitor Cst, and a charge corresponding to a voltage difference between the both ends is stored in the storage capacitor Cst.

During an emission period, the operation control transistor T5 and the emission control transistor T6 are turned on by the emission control signal En supplied from the emission control line EL. A driving current is generated according to a voltage difference between a voltage of the driving gate electrode of the driving transistor T1 and the driving voltage ELVDD, and the driving current is supplied to the organic light emitting diode through the emission control transistor T6.

As described above, some of the plurality of thin-film transistors T1 to T7 may include an oxide semiconductor. For example, the compensation transistor T3 and the first initialization transistor T4 may include an oxide semiconductor.

Because polysilicon has high reliability, the polysilicon may be precisely controlled to flow an intended current. The driving transistor T1, which directly affects the brightness of the display apparatus, includes a semiconductor layer made of polysilicon having high reliability, thereby realizing a high-resolution display apparatus. However, because the oxide semiconductor has high carrier mobility and a low leakage current, the voltage drop is not large even if the driving time is long. That is, in a case of the oxide semiconductor, even when driving at a low frequency, a color change of an image according to a voltage drop is not large, so that driving at a low frequency is possible. Accordingly, the compensation transistor T3 and the first initialization transistor T4 include an oxide semiconductor to prevent leakage current and realize a display apparatus with reduced power consumption.

Such an oxide semiconductor is sensitive to light, and the amount of current may be changed by light from outside. Accordingly, a metal layer may be disposed under the oxide semiconductor to absorb or reflect light from the outside. Accordingly, as shown in FIG. 7, each of the compensation transistor T3 and the first initialization transistor T4 including the oxide semiconductor may have gate electrodes located above and below the oxide semiconductor layer. That is, when viewed from a direction perpendicular to an upper surface of the substrate 100 (the z-axis direction), the metal layer below the oxide semiconductor may overlap the oxide semiconductor.

Figure 8:
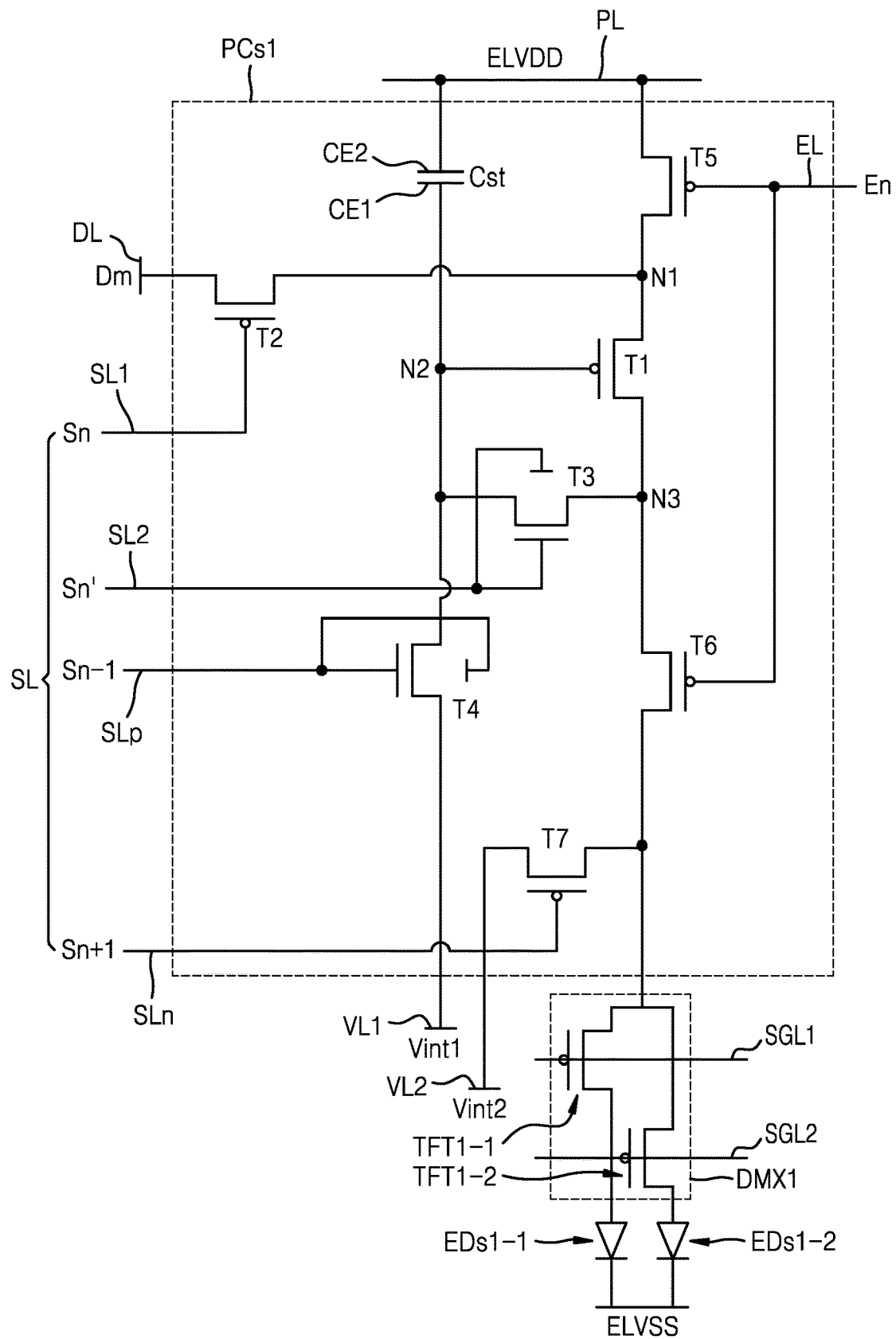
FIG. 8 is an equivalent circuit diagram of an additional pixel circuit included in the display apparatus of FIG. 1 and additional display elements connected thereto.

FIG. 8 is an equivalent circuit diagram of the first additional pixel circuit PCs1 included in the display apparatus 1 of FIG. 1 and the additional display elements EDs1-1 and EDs1-2 connected thereto. The first separation circuit DMX1 is disposed between the first additional pixel circuit PCs1 and the additional display elements EDs1-1 and EDs1-2. That is, an input terminal of the first separation circuit DMX1 may be electrically connected to the emission control transistor T6 and the second initialization transistor T7.

The configuration of the first additional pixel circuit PCs1 is the same as that of the pixel circuit PC described above with reference to FIG. 7. However, the first scan line SL1 of FIG. 8 may or may not be the same as the first scan line SL1 of FIG. 7, and the first scan signal Sn applied to the first scan line SL1 of FIG. 8 may or may not be the same as the first scan signal Sn applied to the first scan line SL1 of FIG. 7. For example, while the pixel circuit PC of FIG. 7 operates once, the first additional pixel circuit PCs1 of FIG. 8 may operate twice.

As such, the first additional pixel circuit PCs1 may include a plurality of transistors and a capacitor, while the first separation circuit DMX1 may include only two transistors. Accordingly, because the configuration of the first separation circuit DMX1 is simpler than that of the first additional pixel circuit PCs1, an area occupied by the first separation circuit DMX1 in the intermediate area MA is much smaller than an area occupied by the first additional pixel circuit PCs1.

So far, a case in which the $1^{st}$-$1^{st}$ additional display element EDs1-1 and the $1^{st}$-$2^{nd}$ additional display element EDs1-2 in the component area CA are electrically connected to the first additional pixel circuit PCs1 in the intermediate area MA via the first separation circuit DMX1 in the intermediate area MA has been described. However, the disclosure is not limited thereto. For example, as shown in FIG. 9, which is a conceptual diagram schematically showing a portion of the display apparatus 1 according to an embodiment, a separation circuit may also be electrically connected to the $1^{st}$-$1^{st}$ auxiliary display element EDa1-1 and a $1^{st}$-$2^{nd}$ auxiliary display element EDa1-2 in the intermediate area MA.

Figure 9:
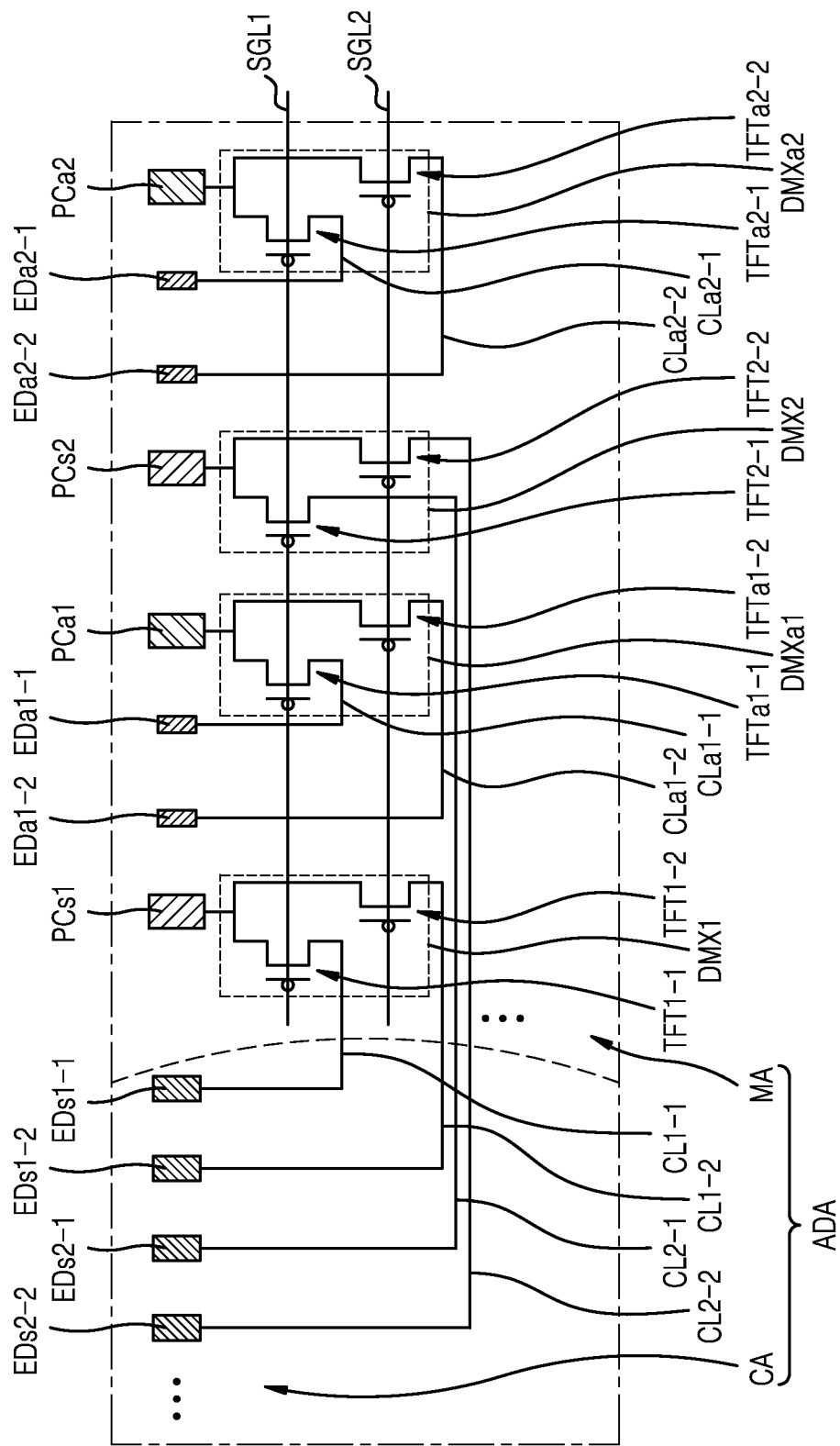
FIG. 9 is a conceptual diagram schematically illustrating a portion of a display apparatus according to an embodiment.

In more detail, as shown in FIG. 9, the display apparatus 1 according to the present embodiment includes a first auxiliary separation circuit DMXa1 having a $1^{st}$-$1^{st}$ auxiliary output terminal, a $1^{st}$-$2^{nd}$ auxiliary output terminal, and a first auxiliary input terminal in the intermediate area MA. The first auxiliary input terminal of the first auxiliary separation circuit DMXa1 is electrically connected to the first auxiliary pixel circuit PCa1 in the intermediate area MA. The $1^{st}$-$1^{st}$ auxiliary display element EDa1-1 in the intermediate area MA is electrically connected to the $1^{st}$-$1^{st}$ auxiliary output terminal of the first auxiliary separation circuit DMXa1 by a $1^{st}$-$1^{st}$ auxiliary connection wire CLa1-1. The $1^{st}$-$2^{nd}$ auxiliary display element EDa1-2 in the intermediate area MA is electrically connected to the $1^{st}$-$2^{nd}$ auxiliary output terminal of the first auxiliary separation circuit DMXa1 by a $1^{st}$-$2^{nd}$ auxiliary connection wire CLa1-2.

In the case of the display apparatus 1 according to the present embodiment as described above, the $1^{st}$-$1^{st}$ auxiliary display element EDa1-1 and the $1^{st}$-$2^{nd}$ auxiliary display element EDa1-2 are controlled by one first auxiliary pixel circuit PCa1 through the first auxiliary separation circuit DMXa1. Accordingly, the number of auxiliary pixel circuits arranged in the intermediate area MA may be remarkably reduced, and thus, a higher-resolution image may be displayed in the intermediate area MA through the $1^{st}$-$1^{st}$ auxiliary display element EDa1-1 and the $1^{st}$-$2^{nd}$ auxiliary display element EDa1-2. Because the configuration of the first auxiliary separation circuit DMXa1 is simpler than that of an auxiliary pixel circuit, an area occupied by the first auxiliary separation circuit DMXa1 in the intermediate area MA is much smaller than an area occupied by one auxiliary pixel circuit.

However, as shown in FIG. 9, the display apparatus 1 according to the present embodiment may further include a second auxiliary pixel circuit PCa2, a second auxiliary separation circuit DMXa2 having a second auxiliary input terminal, a $2^{nd}$-$1^{st}$ auxiliary output terminal, and a $2^{nd}$-$2^{nd}$ auxiliary output terminal, a $2^{nd}$-$1^{st}$ auxiliary display element EDa2-1, and a $2^{nd}$-$2^{nd}$ auxiliary display element EDa2-2 in the intermediate area MA. The second auxiliary pixel circuit PCa2 may be electrically connected to the second auxiliary input terminal of the second auxiliary separation circuit DMXa2. In addition, the $2^{nd}$-$1^{st}$ auxiliary display element EDa2-1 may be connected to the $2^{nd}$-$1^{st}$ auxiliary output terminal of the second auxiliary separation circuit DMXa2 via a $2^{nd}$-$1^{st}$ auxiliary connection wire CLa2-1, and the $2^{nd}$-$2^{nd}$ auxiliary display element EDa2-2 may be connected to the $2^{nd}$-$2^{nd}$ auxiliary output terminal of the second auxiliary separation circuit DMXa2 via a $2^{nd}$-$2^{nd}$ auxiliary connection wire CLa2-2. Accordingly, the $2^{nd}$-$1^{st}$ auxiliary display element EDa2-1 and the $2^{nd}$-$2^{nd}$ auxiliary display element EDa2-2 may be controlled through the second auxiliary pixel circuit PCa2.

The first auxiliary separation circuit DMXa1, as shown in FIG. 9, may include a $1^{st}$-$1^{st}$ auxiliary transistor TFTa1-1 connecting the first auxiliary input terminal to the $1^{st}$-$1^{st}$ auxiliary output terminal and a $1^{st}$-$2^{nd}$ auxiliary transistor TFTa1-2 connecting the first auxiliary input terminal to the $1^{st}$-$2^{nd}$ auxiliary output terminal. Similarly, the second auxiliary separation circuit DMXa2 may include a $2^{nd}$-$1^{st}$ auxiliary transistor TFTa2-1 connecting the second auxiliary input terminal to the $2^{nd}$-$1^{st}$ auxiliary output terminal, and a $2^{nd}$-$2^{nd}$ auxiliary transistor TFTa2-2 connecting the second auxiliary input terminal to the $2^{nd}$-$2^{nd}$ auxiliary output terminal. As described above, because the first auxiliary separation circuit DMXa1 and the second auxiliary separation circuit DMXa2 have a simpler configuration than that of the auxiliary pixel circuit to be described later, the area of each of the first auxiliary separation circuit DMXa1 and the second auxiliary separation circuit DMXa2 may be less than that of the auxiliary pixel circuit.

A gate electrode of the $1^{st}$-$1^{st}$ auxiliary transistor TFTa1-1 of the first auxiliary separation circuit DMXa1 and a gate electrode of the $2^{nd}$-$1^{st}$ auxiliary transistor TFTa2-1 of the second auxiliary separation circuit DMXa2 may be electrically connected to the first signal line SGL1. In addition, a gate electrode of the $1^{st}$-$2^{nd}$ auxiliary transistor TFTa1-2 of the first auxiliary separation circuit DMXa1 and a gate electrode of the $2^{nd}$-$2^{nd}$ auxiliary transistor TFTa2-2 of the second auxiliary separation circuit DMXa2 may be electrically connected to the second signal line SGL2. Accordingly, operation of the $1^{st}$-$1^{st}$ transistor TFT1-1 of the first separation circuit DMX1, the $2^{nd}$-$1^{st}$ transistor TFT2-1 of the second separation circuit DMX2, the $1^{st}$-$1^{st}$ auxiliary transistor TFTa1-1 of the first auxiliary separation circuit DMXa1, and the $2^{nd}$-$1^{st}$ auxiliary transistor TFTa2-1 of the second auxiliary separation circuit DMXa2 may be controlled through the first signal line SGL1, and operation of the $1^{st}$-$2^{nd}$ transistor TFT1-2 of the first separation circuit DMX1, the $2^{nd}$-$2^{nd}$ transistor TFT2-2 of the second separation circuit DMX2, the $1^{st}$-$2^{nd}$ auxiliary transistor TFTa1-2 of the first auxiliary separation circuit DMXa1, and the $2^{nd}$-$2^{nd}$ auxiliary transistor TFTa2-2 of the second auxiliary separation circuit DMXa2 may be controlled through the second signal line SGL2.

When the $1^{st}$-$1^{st}$ transistor TFT1-1, the $2^{nd}$-$1^{st}$ transistor TFT2-1, the $1^{st}$-$1^{st}$ auxiliary transistor TFTa1-1 and the $2^{nd}$-$1^{st}$ auxiliary transistor TFTa2-1 are turned on through the first signal line SGL1, the $1^{st}$-$2^{nd}$ transistor TFT1-2, the $2^{nd}$-$2^{nd}$ transistor TFT2-2, the $1^{st}$-$2^{nd}$ auxiliary transistor TFTa1-2, and the $2^{nd}$-$2^{nd}$ auxiliary transistor TFTa2-2 may be turned off through the second signal line SGL2. When the $1^{st}$-$1^{st}$ transistor TFT1-1, the $2^{nd}$-$1^{st}$ transistor TFT2-1, the $1^{st}$-$1^{st}$ auxiliary transistor TFTa1-1, and the $2^{nd}$-$1^{st}$ auxiliary transistor TFTa2-1 are turned off through the first signal line SGL1, the $1^{st}$-$2^{nd}$ transistor TFT1-2, the $2^{nd}$-$2^{nd}$ transistor TFT2-2, the $1^{st}$-$2^{nd}$ auxiliary transistor TFTa1-2, and the $2^{nd}$-$2^{nd}$ auxiliary transistor TFTa2-2 may be turned on through the second signal line SGL2. Therefore, when the $1^{st}$-$1^{st}$ transistor TFT1-1, the $2^{nd}$-$1^{st}$ transistor TFT2-1, the $1^{st}$-$1^{st}$ auxiliary transistor TFTa1-1, and the $2^{nd}$-$1^{st}$ auxiliary transistor TFTa2-1 are turned on through the first signal line SGL1, the first additional pixel circuit PCs1 may control the $1^{st}$-$1^{st}$ additional display element EDs1-1, the second additional pixel circuit PCs2 may control the $2^{nd}$-$1^{st}$ additional display element EDs2-1, the first auxiliary pixel circuit PCa1 may control the $1^{st}$-$1^{st}$ auxiliary display element EDa1-1, and the second auxiliary pixel circuit PCa2 may control the $2^{nd}$-$1^{st}$ auxiliary display element EDa2-1. When the $1^{st}$-$2^{nd}$ transistor TFT1-2, the $2^{nd}$-$2^{nd}$ transistor TFT2-2, the $1^{st}$-$2^{nd}$ auxiliary transistor TFTa1-2, and the $2^{nd}$-$2^{nd}$ auxiliary transistor TFTa2-2 are turned on through the second signal line SGL2, the first additional pixel circuit PCs1 may control the $1^{st}$-$2^{nd}$ additional display elements EDs1-2, the second additional pixel circuit PCs2 may control the $2^{nd}$-$2^{nd}$ additional display element EDs2-2, the first auxiliary pixel circuit PCa1 may control the $1^{st}$-$2^{nd}$ auxiliary display elements EDa1-2, and the second auxiliary pixel circuit PCa2 may control the $2^{nd}$-$2^{nd}$ auxiliary display element EDa2-2.

Although FIG. 9 illustrates that the gate electrode of the $1^{st}$-$1^{st}$ auxiliary transistor TFTa1-1 of the first auxiliary separation circuit DMXa1 and the gate electrode of the $2^{nd}$-$1^{st}$ auxiliary transistor TFTa2-1 of the second auxiliary separation circuit DMXa2 are electrically connected to the first signal line SGL1, and the gate electrode of the $1^{st}$-$2^{nd}$ auxiliary transistors TFTa1-2 of the first auxiliary separation circuit DMXa1 and the gate electrode of the $2^{nd}$-$2^{nd}$ auxiliary transistor TFTa2-2 of the second auxiliary separation circuit DMXa2 are electrically connected to the second signal line SGL2, the disclosure is not limited thereto. For example, the gate electrode of the $1^{st}$-$1^{st}$ auxiliary transistor TFTa1-1 of the first auxiliary separation circuit DMXa1 and the gate electrode of the $2^{nd}$-$1^{st}$ auxiliary transistor TFTa2-1 of the second auxiliary separation circuit DMXa2 may be electrically connected to a separate first auxiliary signal line other than the first signal line SGL1, and the gate electrode of the $1^{st}$-$2^{nd}$ auxiliary transistor TFTa1-2 of the first auxiliary separation circuit DMXa1 and the gate electrode of the $2^{nd}$-$2^{nd}$ auxiliary transistor TFTa2-2 of the second auxiliary separation circuit DMXa2 may be electrically connected to a separate second auxiliary signal line other than the second signal line SGL2.

Figure 10:
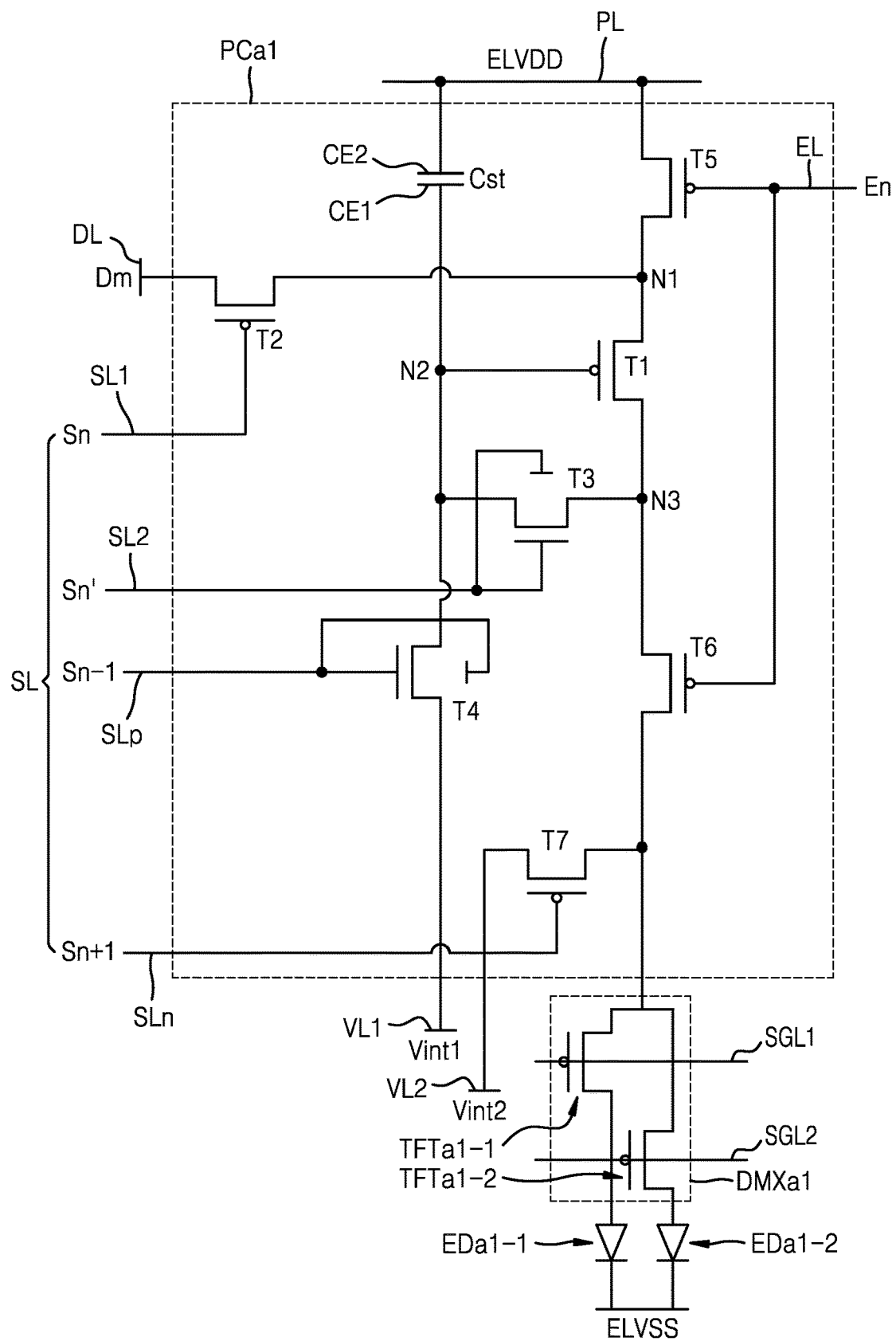
FIG. 10 is an equivalent circuit diagram of an auxiliary pixel circuit included in the display apparatus of FIG. 9 and auxiliary display elements connected thereto.

FIG. 10 is an equivalent circuit diagram of the first auxiliary pixel circuit PCa1 included in the display apparatus 1 of FIG. 9 and the auxiliary display elements EDa1-1 and EDa1-2 connected thereto. The first auxiliary separation circuit DMXa1 is interposed between the first auxiliary pixel circuit PCa1 and the auxiliary display elements EDa1-1 and EDa1-2. That is, an input terminal of the first auxiliary separation circuit DMXa1 may be electrically connected to the emission control transistor T6 and the second initialization transistor T7. The configuration of the first auxiliary pixel circuit PCa1 is the same as that of the first additional pixel circuit PCs1 described above with reference to FIG. 8.

As such, the first auxiliary pixel circuit PCa1 may include a plurality of transistors and a capacitor, while the first auxiliary separation circuit DMXa1 may include only two transistors. Accordingly, because the configuration of the first auxiliary separation circuit DMXa1 is simpler than that of the first auxiliary pixel circuit PCa1, an area occupied by the first auxiliary separation circuit DMXa1 in the intermediate area MA is much smaller than an area occupied by the first auxiliary pixel circuit PCa1.

Figure 11:
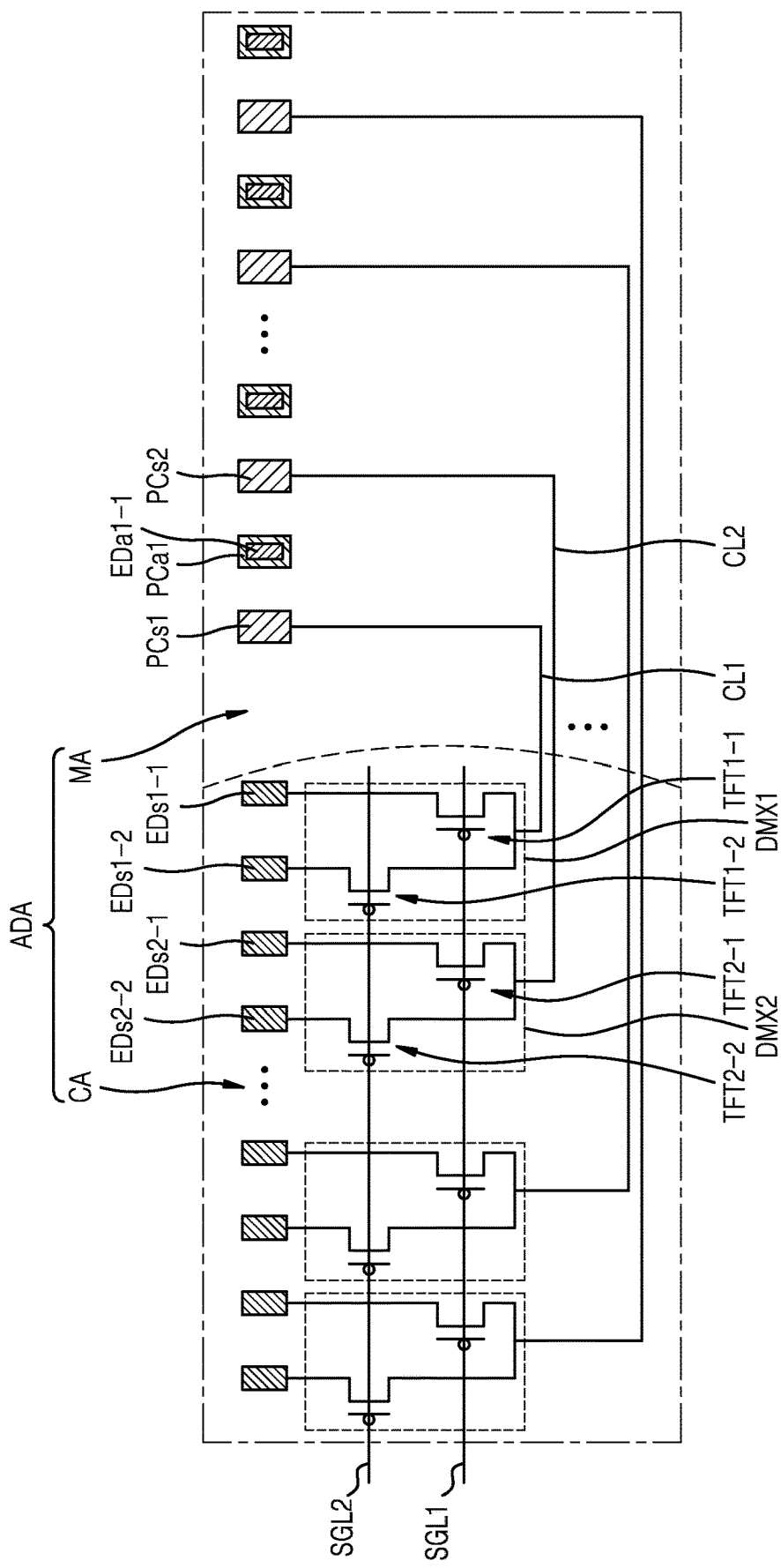
FIG. 11 is a conceptual diagram schematically illustrating a portion of a display apparatus according to an embodiment.

FIG. 11 is a conceptual diagram schematically illustrating a portion of a display apparatus 1 according to an embodiment. The display apparatus 1 according to the present embodiment is different from the display apparatus 1 described above with reference to FIG. 6 in locations of the first separation circuit DMX1 and the second separation circuit DMX2. That is, in the case of the display apparatus 1 according to the present embodiment, the first separation circuit DMX1 and the second separation circuit DMX2 are located in the component area CA instead of the intermediate area MA.

In the case of the display apparatus 1 according to the embodiment described above with reference to FIG. 6, because the first separation circuit DMX1 is located in the intermediate area MA, the $1^{st}$-$1^{st}$ connection wire CL1-1 connecting the $1^{st}$-$1^{st}$ output terminal of the first separation circuit DMX1 to the $1^{st}$-$1^{st}$ additional display element EDs1-1, and the $1^{st}$-$2^{nd}$ connection wire CL1-2 connecting the $1^{st}$-$2^{nd}$ output terminal of the first separation circuit DMX1 to the $1^{st}$-$2^{nd}$ additional display elements EDs1-2 cross the boundary between the intermediate area MA and the component area CA. However, in the case of the display apparatus 1 according to the present embodiment, because the first separation circuit DMX1 is located in the component area CA, only a first connection wire CL1 connecting the first additional pixel circuit PCs1 to a first input terminal of the first separation circuit DMX1 crosses the boundary between the intermediate area MA and the component area CA. Therefore, in the case of the display apparatus 1 according to the present embodiment, the number of connection wires crossing the boundary between the intermediate area MA and the component area CA may be remarkably reduced. The reduction in the number of such connection wires may result in an increase in resolution in the auxiliary display area ADA.

However, because the first separation circuit DMX1 is located in the component area CA, the area of the transmission area TA in the component area CA may be reduced. However, because the configuration of the first separation circuit DMX1 is very simple, although the first separation circuit DMX1 is located in the component area CA, the area of the transmission area TA in the component area CA may not be significantly reduced.

As shown in FIG. 11, the second separation circuit DMX2 may also be located in the component area CA so that only a second connection wire CL2 connecting the second additional pixel circuit PCs2 to a second input terminal of the second separation circuit DMX2 crosses the boundary between the intermediate area MA and the component area CA.

The first separation circuit DMX1, as shown in FIG. 11, may include the $1^{st}$-$1^{st}$ transistor TFT1-1 connecting the first input terminal to the $1^{st}$-$1^{st}$ output terminal and the $1^{st}$-$2^{nd}$ transistor TFT1-2 connecting the first input terminal to the $1^{st}$-$2^{nd}$ output terminal. Similarly, the second separation circuit DMX2 may include the $2^{nd}$-$1^{st}$ transistor TFT2-1 connecting the second input terminal to the $2^{nd}$-$1^{st}$ output terminal, and the $2^{nd}$-$2^{nd}$ transistor TFT2-2 connecting the second input terminal to the $2^{nd}$-$2^{nd}$ output terminal. As described above, because the first separation circuit DMX1 and the second separation circuit DMX2 have a simpler configuration than that of an additional pixel circuit, the area of each of the first separation circuit DMX1 and the second separation circuit DMX2 may be less than that of the additional pixel circuit.

The gate electrode of the $1^{st}$-$1^{st}$ transistor TFT1-1 of the first separation circuit DMX1 and the gate electrode of the $2^{nd}$-$1^{st}$ transistor TFT2-1 of the second separation circuit DMX2 may be electrically connected to the first signal line SGL1. In addition, the gate electrode of the $1^{st}$-$2^{nd}$ transistor TFT1-2 of the first separation circuit DMX1 and the gate electrode of the $2^{nd}$-$2^{nd}$ transistor TFT2-2 of the second separation circuit DMX2 may be electrically connected to the second signal line SGL2. Accordingly, operation of the $1^{st}$-$1^{st}$ transistor TFT1-1 of the first separation circuit DMX1 and the $2^{nd}$-$1^{st}$ transistor TFT2-1 of the second separation circuit DMX2 may be controlled through the first signal line SGL1, and operation of the $1^{st}$-$2^{nd}$ transistor TFT1-2 of the first separation circuit DMX1 and the $2^{nd}$-$2^{nd}$ transistor TFT2-2 of the second separation circuit DMX2 may be controlled through the second signal line SGL2.

That is, when the $1^{st}$-$1^{st}$ transistor TFT1-1 and the $2^{nd}$-$1^{st}$ transistor TFT2-1 are turned on through the first signal line SGL1, the $1^{st}$-$2^{nd}$ transistor TFT1-2 and the $2^{nd}$-$2^{nd}$ transistor TFT2-2 may be turned off through the second signal line SGL2. When the $1^{st}$-$1^{st}$ transistor TFT1-1 and the $2^{nd}$-$1^{st}$ transistor TFT2-1 are turned off through the first signal line SGL1, the $1^{st}$-$2^{nd}$ transistor TFT1-2 and the $2^{nd}$-$2^{nd}$ transistor TFT2-2 may be turned on through the second signal line SGL2. Accordingly, when the $1^{st}$-$1^{st}$ transistor TFT1-1 and the $2^{nd}$-$1^{st}$ transistor TFT2-1 are turned on through the first signal line SGL1, the first additional pixel circuit PCs1 may control the $1^{st}$-$1^{st}$ additional display element EDs1-1, and the second additional pixel circuit PCs2 may control the $2^{nd}$-$1^{st}$ additional display element EDs2-1. When the $1^{st}$-$2^{nd}$ transistor TFT1-2 and the $2^{nd}$-$2^{nd}$ transistor TFT2-2 are turned on through the second signal line SGL2, the first additional pixel circuit PCs1 may control the $1^{st}$-$2^{nd}$ additional display element EDs1-2, and the second additional pixel circuit PCs2 may control the $2^{nd}$-$2^{nd}$ additional display element EDs2-2.

While the first additional pixel circuit PCs1 controls the $1^{st}$-$1^{st}$ additional display element EDs1-1 and the $1^{st}$-$2^{nd}$ additional display element EDs1-2, the first auxiliary pixel circuit PCa1 may control the $1^{st}$-$1^{st}$ auxiliary display element EDa1-1. In addition, the first signal line SGL1 and the second signal line SGL2 may receive a selection signal from a separation circuit and a driving circuit in the peripheral area NDA.

In the embodiment described with reference to FIG. 11, a case in which the $1^{st}$-$1^{st}$ additional display element EDs1-1 and the $1^{st}$-$2^{nd}$ additional display element Eds1-2 in the component area CA are electrically connected to the first additional pixel circuit PCs1 in the intermediate area MA by the first separation circuit DMX1 in the component area CA has been described. However, the disclosure is not limited thereto. For example, as shown in FIG. 12, which is a conceptual diagram schematically showing a portion of the display apparatus according to an embodiment, a separation circuit may also be electrically connected to the $1^{st}$-$1^{st}$ auxiliary display element EDa1-1 and the $1^{st}$-$2^{nd}$ auxiliary display element EDa1-2 in the intermediate area MA.

Figure 12:
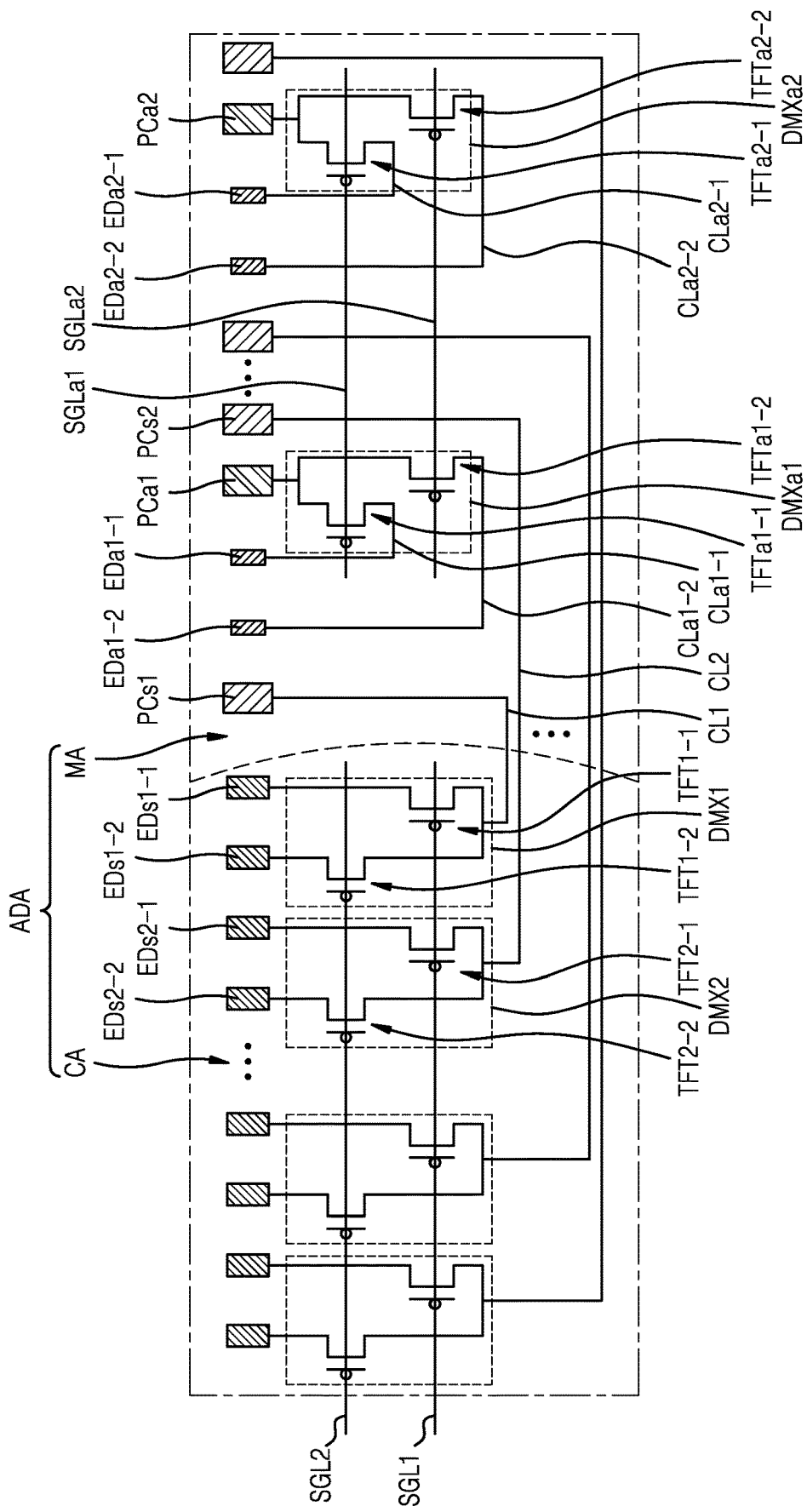
FIG. 12 is a conceptual diagram schematically illustrating a portion of a display apparatus according to an embodiment.

In more detail, as shown in FIG. 12, the display apparatus 1 according to the present embodiment includes the first auxiliary separation circuit DMXa1 having the $1^{st}$-$1^{st}$ auxiliary output terminal, the $1^{st}$-$2^{nd}$ auxiliary output terminal, and the first auxiliary input terminal in the intermediate area MA. The first auxiliary input terminal of the first auxiliary separation circuit DMXa1 is electrically connected to the first auxiliary pixel circuit PCa1 in the intermediate area MA. The $1^{st}$-$1^{st}$ auxiliary display element EDa1-1 in the intermediate area MA is electrically connected to the $1^{st}$-$1^{st}$ auxiliary output terminal of the first auxiliary separation circuit DMXa1 by a $1^{st}$-$1^{st}$ auxiliary connection wire CLa1-1. The $1^{st}$-$2^{nd}$ auxiliary display element EDa1-2 in the intermediate area MA is electrically connected to the $1^{st}$-$2^{nd}$ auxiliary output terminal of the first auxiliary separation circuit DMXa1 by a $1^{st}$-$2^{nd}$ auxiliary connection wire CLa1-2.

In the case of the display apparatus 1 according to the present embodiment as described above, the $1^{st}$-$1^{st}$ auxiliary display element EDa1-1 and the $1^{st}$-$2^{nd}$ auxiliary display element EDa1-2 are controlled by one first auxiliary pixel circuit PCa1 through the first auxiliary separation circuit DMXa1. Accordingly, the number of auxiliary pixel circuits arranged in the intermediate area MA may be remarkably reduced, and thus, a higher-resolution image may be displayed in the intermediate area MA through the $1^{st}$-$1^{st}$ auxiliary display element EDa1-1 and the $1^{st}$-$2^{nd}$ auxiliary display element EDa1-2. Because the configuration of the first auxiliary separation circuit DMXa1 is simpler than that of the auxiliary pixel circuit, an area occupied by the first auxiliary separation circuit DMXa1 in the intermediate area MA is much smaller than an area occupied by one auxiliary pixel circuit.

However, as shown in FIG. 12, the display apparatus 1 according to the present embodiment may further include the second auxiliary pixel circuit PCa2, the second auxiliary separation circuit DMXa2 having the second auxiliary input terminal, the $2^{nd}$-$1^{st}$ auxiliary output terminal, and the $2^{nd}$-$2^{nd}$ auxiliary output terminal, the $2^{nd}$-$1^{st}$ auxiliary display element EDa2-1, and the $2^{nd}$-$2^{nd}$ auxiliary display element EDa2-2 in the intermediate area MA. The second auxiliary pixel circuit PCa2 may be electrically connected to the second auxiliary input terminal of the second auxiliary separation circuit DMXa2. In addition, the $2^{nd}$-$1^{st}$ auxiliary display element EDa2-1 may be connected to the $2^{nd}$-$1^{st}$ auxiliary output terminal of the second auxiliary separation circuit DMXa2 via the $2^{nd}$-$1^{st}$ auxiliary connection wire CLa2-1, and the $2^{nd}$-$2^{nd}$ auxiliary display element EDa2-2 may be connected to the $2^{nd}$-$2^{nd}$ auxiliary output terminal of the second auxiliary separation circuit DMXa2 via the $2^{nd}$-$2^{nd}$ auxiliary connection wire CLa2-2. Accordingly, the $2^{nd}$-$1^{st}$ auxiliary display element EDa2-1 and the $2^{nd}$-$2^{nd}$ auxiliary display element EDa2-2 may be controlled through the second auxiliary pixel circuit PCa2.

The first auxiliary separation circuit DMXa1, as shown in FIG. 12, may include the $1^{st}$-$1^{st}$ auxiliary transistor TFTa1-1 connecting the first auxiliary input terminal to the $1^{st}$-$1^{st}$ auxiliary output terminal and the $1^{st}$-$2^{nd}$ auxiliary transistor TFTa1-2 connecting the first auxiliary input terminal to the $1^{st}$-$2^{nd}$ auxiliary output terminal. Similarly, the second auxiliary separation circuit DMXa2 may include the $2^{nd}$-$1^{st}$ auxiliary transistor TFTa2-1 connecting the second auxiliary input terminal to the $2^{nd}$-$1^{st}$ auxiliary output terminal, and the $2^{nd}$-$2^{nd}$ auxiliary transistor TFTa2-2 connecting the second auxiliary input terminal to the $2^{nd}$-$2^{nd}$ auxiliary output terminal. As described above, because the first auxiliary separation circuit DMXa1 and the second auxiliary separation circuit DMXa2 have a simpler configuration than that of the auxiliary pixel circuit to be described later, the area of each of the first auxiliary separation circuit DMXa1 and the second auxiliary separation circuit DMXa2 may be less than that of the auxiliary pixel circuit.

The gate electrode of the $1^{st}$-$1^{st}$ auxiliary transistor TFTa1-1 of the first auxiliary separation circuit DMXa1 and the gate electrode of the $2^{nd}$-$1^{st}$ auxiliary transistor TFTa2-1 of the second auxiliary separation circuit DMXa2 may be electrically connected to a first auxiliary signal line SGLa1. In addition, the gate electrode of the $1^{st}$-$2^{nd}$ auxiliary transistor TFTa1-2 of the first auxiliary separation circuit DMXa1 and the gate electrode of the $2^{nd}$-$2^{nd}$ auxiliary transistor TFTa2-2 of the second auxiliary separation circuit DMXa2 may be electrically connected to a second auxiliary signal line SGLa2. Accordingly, operation of the $1^{st}$-$1^{st}$ auxiliary transistor TFTa1-1 of the first auxiliary separation circuit DMXa1 and the $2^{nd}$-$1^{st}$ auxiliary transistor TFTa2-1 of the second auxiliary separation circuit DMXa2 may be controlled through the first auxiliary signal line SGLa1, and operation of the $1^{st}$-$2^{nd}$ auxiliary transistor TFTa1-2 of the first auxiliary separation circuit DMXa1 and the $2^{nd}$-$2^{nd}$ auxiliary transistor TFTa2-2 of the second auxiliary separation circuit DMXa2 may be controlled through the second auxiliary signal line SGLa2.

That is, when the $1^{st}$-$1^{st}$ auxiliary transistor TFTa1-1 and the $2^{nd}$-$1^{st}$ auxiliary transistor TFTa2-1 are turned on through the first auxiliary signal line SGLa1, the $1^{st}$-$2^{nd}$ auxiliary transistor TFTa1-2 and the $2^{nd}$-$2^{nd}$ auxiliary transistor TFTa2-2 may be turned off through the second auxiliary signal line SGLa2. When the $1^{st}$-$1^{st}$ auxiliary transistor TFTa1-1 and the $2^{nd}$-$1^{st}$ auxiliary transistor TFTa2-1 are turned off through the first auxiliary signal line SGLa1, the $1^{st}$-$2^{nd}$ auxiliary transistor TFTa1-2 and the $2^{nd}$-$2^{nd}$ auxiliary transistor TFTa2-2 may be turned on through the second auxiliary signal line SGLa2. Accordingly, when the $1^{st}$-$1^{st}$ auxiliary transistor TFTa1-1 and the $2^{nd}$-$1^{st}$ auxiliary transistor TFTa2-1 are turned on through the first auxiliary signal line SGLa1, the first auxiliary pixel circuit PCa1 may control the $1^{st}$-$1^{st}$ auxiliary display element EDa1-1, and the second auxiliary pixel circuit PCa2 may control the $2^{nd}$-$1^{st}$ auxiliary display element EDa2-1. When the $1^{st}$-$2^{nd}$ auxiliary transistor TFTa1-2 and the $2^{nd}$-$2^{nd}$ auxiliary transistor TFTa2-2 are turned on through the second auxiliary signal line SGLa2, the first auxiliary pixel circuit PCa1 may control the $1^{st}$-$2^{nd}$ auxiliary display element EDa1-2, and the second auxiliary pixel circuit PCa2 may control the $2^{nd}$-$2^{nd}$ auxiliary display element EDa2-2.

In FIG. 12, the first signal line SGL1 and the first auxiliary signal line SGLa1 are not connected to each other and the second signal line SGL2 and the second auxiliary signal line SGLa2 are not connected to each other, but the disclosure is not limited thereto. For example, the first signal line SGL1 and the first auxiliary signal line SGLa1 may be electrically connected to each other or may be integrated with each other, and the second signal line SGL2 and the second auxiliary signal line SGLa2 may be electrically connected to each other or may be integrated with each other.

According to an embodiment as described above, a display apparatus capable of displaying high-quality images may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate including an auxiliary display area and a main display area surrounding the auxiliary display area, the auxiliary display area including a component area and an intermediate area;
    a first auxiliary pixel circuit, a first additional pixel circuit, a first separation circuit, and a $1^{st}$-$1^{st}$ auxiliary display element that are arranged in the intermediate area, the first separation circuit including a $1^{st}$-$1^{st}$ output terminal, a $1^{st}$-$2^{nd}$ output terminal, and a first input terminal that is electrically connected to the first additional pixel circuit, the $1^{st}$-$1^{st}$ auxiliary display element being electrically connected to the first auxiliary pixel circuit;
    a $1^{st}$-$1^{st}$ additional display element and a $1^{st}$-$2^{nd}$ additional display element that are arranged in the component area;
    a $1^{st}$-$1^{st}$ connection wire electrically connecting the $1^{st}$-$1^{st}$ output terminal to the $1^{st}$-$1^{st}$ additional display element; and
    a $1^{st}$-$2^{nd}$ connection wire electrically connecting the $1^{st}$-$2^{nd}$ output terminal to the $1^{st}$-$2^{nd}$ additional display element.

2. The display apparatus of claim 1, further comprising:
    a second additional pixel circuit in the intermediate area;
    a second separation circuit arranged in the intermediate area and having a $2^{nd}$-$1^{st}$ output terminal, a $2^{nd}$-$2^{nd}$ output terminal, and a second input terminal that is electrically connected to the second additional pixel circuit;
    a $2^{nd}$-$1^{st}$ additional display element and a $2^{nd}$-$2^{nd}$ additional display element that are arranged in the component area;
    a $2^{nd}$-$1^{st}$ connection wire electrically connecting the $2^{nd}$-$1^{st}$ output terminal to the $2^{nd}$-$1^{st}$ additional display element; and
    a $2^{nd}$-$2^{nd}$ connection wire electrically connecting the $2^{nd}$-$2^{nd}$ output terminal to the $2^{nd}$-$2^{nd}$ additional display element.

3. The display apparatus of claim 2, wherein the first separation circuit comprises a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the second separation circuit comprises a $2^{nd}$-$1^{st}$ transistor connecting the second input terminal to the $2^{nd}$-$1^{st}$ output terminal and a $2^{nd}$-$2^{nd}$ transistor connecting the second input terminal to the $2^{nd}$-$2^{nd}$ output terminal.

4. The display apparatus of claim 3, further comprising:
    a first signal line applying an electrical signal to a gate electrode of the $1^{st}$-$1^{st}$ transistor and a gate electrode of the $2^{nd}$-$1^{st}$ transistor; and a second signal line applying an electrical signal to a gate electrode of the $1^{st}$-$2^{nd}$ transistor and a gate electrode of the $2^{nd}$-$2^{nd}$ transistor.

5. The display apparatus of claim 4, wherein, when the $1^{st}$-$1^{st}$ transistor and the $2^{nd}$-$1^{st}$ transistor are turned on through the first signal line, the $1^{st}$-$2^{nd}$ transistor and the $2^{nd}$-$2^{nd}$ transistor are turned off, and when the $1^{st}$-$2^{nd}$ transistor and the $2^{nd}$-$2^{nd}$ transistor are turned on through the second signal line, the $1^{st}$-$1^{st}$ transistor and the $2^{nd}$-$1^{st}$ transistor are turned off.

6. The display apparatus of claim 1, further comprising:
a first auxiliary separation circuit arranged in the intermediate area and having a $1^{st}$-$1^{st}$ auxiliary output terminal, a $1^{st}$-$2^{nd}$ auxiliary output terminal, and a first auxiliary input terminal that is electrically connected to the first auxiliary pixel circuit; and
a $1^{st}$-$2^{nd}$ auxiliary display element arranged in the intermediate area and electrically connected to the $1^{st}$-$2^{nd}$ auxiliary output terminal,
wherein the $1^{st}$-$1^{st}$ auxiliary display element is electrically connected to the $1^{st}$-$1^{st}$ auxiliary output terminal.

7. The display apparatus of claim 6, further comprising:
a second auxiliary pixel circuit arranged in the intermediate area;
a second auxiliary separation circuit arranged in the intermediate area and having a $2^{nd}$-$1^{st}$ auxiliary output terminal, a $2^{nd}$-$2^{nd}$ auxiliary output terminal, and a second auxiliary input terminal that is electrically connected to the second auxiliary pixel circuit;
a $2^{nd}$-$1^{st}$ auxiliary display element arranged in the intermediate area and electrically connected to the $2^{nd}$-$1^{st}$ auxiliary output terminal; and
a $2^{nd}$-$2^{nd}$ auxiliary display element arranged in the intermediate area and electrically connected to the $2^{nd}$-$2^{nd}$ auxiliary output terminal.

8. The display apparatus of claim 7, wherein the first auxiliary separation circuit comprises a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal, and the second auxiliary separation circuit comprises a $2^{nd}$-$1^{st}$ auxiliary transistor connecting the second auxiliary input terminal to the $2^{nd}$-$1^{st}$ auxiliary output terminal and a $2^{nd}$-$2^{nd}$ auxiliary transistor connecting the second auxiliary input terminal to the $2^{nd}$-$2^{nd}$ auxiliary output terminal.

9. The display apparatus of claim 8, further comprising:
a first auxiliary signal line applying an electrical signal to a gate electrode of the $1^{st}$-$1^{st}$ auxiliary transistor and a gate electrode of the $2^{nd}$-$1^{st}$ auxiliary transistor; and
a second auxiliary signal line applying an electrical signal to a gate electrode of the $1^{st}$-$2^{nd}$ auxiliary transistor and a gate electrode of the $2^{nd}$-$2^{nd}$ auxiliary transistor.

10. The display apparatus of claim 9, wherein, when the $1^{st}$-$1^{st}$ auxiliary transistor and the $2^{nd}$-$1^{st}$ auxiliary transistor are turned on through the first auxiliary signal line, the $1^{st}$-$2^{nd}$ auxiliary transistor and the $2^{nd}$-$2^{nd}$ auxiliary transistor are turned off, and when the $1^{st}$-$2^{nd}$ auxiliary transistor and the $2^{nd}$-$2^{nd}$ auxiliary transistor are turned on through the second auxiliary signal line, the $1^{st}$-$1^{st}$ auxiliary transistor and the $2^{nd}$-$1^{st}$ auxiliary transistor are turned off.

11. The display apparatus of claim 6, wherein the first separation circuit comprises a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the first auxiliary separation circuit comprises a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal.

12. The display apparatus of claim 11, further comprising:
a first signal line applying an electrical signal to a gate electrode of the $1^{st}$-$1^{st}$ transistor and a gate electrode of the $1^{st}$-$1^{st}$ auxiliary transistor; and
a second signal line applying an electrical signal to a gate electrode of the $1^{st}$-$2^{nd}$ transistor and a gate electrode of the $1^{st}$-$2^{nd}$ auxiliary transistor.

13. The display apparatus of claim 12, wherein, when the $1^{st}$-$1^{st}$ transistor and the $1^{st}$-$1^{st}$ auxiliary transistor are turned on through the first signal line, the $1^{st}$-$2^{nd}$ transistor and the $1^{st}$-$2^{nd}$ auxiliary transistor are turned off, and when the $1^{st}$-$2^{nd}$ transistor and the $1^{st}$-$2^{nd}$ auxiliary transistor are turned on through the second signal line, the $1^{st}$-$1^{st}$ transistor and the $1^{st}$-$1^{st}$ auxiliary transistor are turned off.

14. A display apparatus comprising:
a substrate including an auxiliary display area and a main display area surrounding the auxiliary display area, the auxiliary display area including a component area and an intermediate area;
a first auxiliary pixel circuit, a first additional pixel circuit, and a $1^{st}$-$1^{st}$ auxiliary display element that are arranged in the intermediate area, the $1^{st}$-$1^{st}$ auxiliary display element being electrically connected to the first auxiliary pixel circuit;
a first separation circuit, a $1^{st}$-$1^{st}$ additional display element, and a $1^{st}$-$2^{nd}$ additional display element that are arranged in the component area, the first separation circuit including a $1^{st}$-$1^{st}$ output terminal, a $1^{st}$-$2^{nd}$ output terminal, and a first input terminal, the $1^{st}$-$1^{st}$ additional display element being electrically connected to the $1^{st}$-$1^{st}$ output terminal, the $1^{st}$-$2^{nd}$ additional display element being electrically connected to the $1^{st}$-$2^{nd}$ output terminal; and
a first connection wire electrically connecting the first additional pixel circuit to the first input terminal.

15. The display apparatus of claim 14, further comprising:
a second additional pixel circuit in the intermediate area;
a second separation circuit, a $2^{nd}$-$1^{st}$ additional display element, and a $2^{nd}$-$2^{nd}$ additional display element that are arranged in the component area, the second separation circuit including a $2^{nd}$-$1^{st}$ output terminal, a $2^{nd}$-$2^{nd}$ output terminal, and a second input terminal, the $2^{nd}$-$1^{st}$ additional display element being electrically connected to the $2^{nd}$-$1^{st}$ output terminal, the $2^{nd}$-$2^{nd}$ additional display element being electrically connected to the $2^{nd}$-$2^{nd}$ output terminal; and
a second connection wire electrically connecting the second additional pixel circuit to the second input terminal.

16. The display apparatus of claim 15, wherein the first separation circuit comprises a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the second separation circuit comprises a $2^{nd}$-$1^{st}$ transistor connecting the second input terminal to the $2^{nd}$-$1^{st}$ output terminal and a $2^{nd}$-$2^{nd}$ transistor connecting the second input terminal to the $2^{nd}$-$2^{nd}$ output terminal.

17. The display apparatus of claim 16, further comprising:
a first signal line applying an electrical signal to a gate electrode of the $1^{st}$-$1^{st}$ transistor and a gate electrode of the $2^{nd}$-$1^{st}$ transistor; and a second signal line applying an electrical signal to a gate electrode of the $1^{st}$-$2^{nd}$ transistor and a gate electrode of the $2^{nd}$-$2^{nd}$ transistor.

18. The display apparatus of claim 17, wherein, when the $1^{st}$-$1^{st}$ transistor and the $2^{nd}$-$1^{st}$ transistor are turned on through the first signal line, the $1^{st}$-$2^{nd}$ transistor and the $2^{nd}$-$2^{nd}$ transistor are turned off, and when the $1^{st}$-$2^{nd}$ transistor and the $2^{nd}$-$2^{nd}$ transistor are turned on through the second signal line, the $1^{st}$-$1^{st}$ transistor and the $2^{nd}$-$1^{st}$ transistor are turned off.

19. The display apparatus of claim 14, further comprising:
a first auxiliary separation circuit arranged in the intermediate area and having a $1^{st}$-$1^{st}$ auxiliary output terminal, a $1^{st}$-$2^{nd}$ auxiliary output terminal, and a first auxiliary input terminal that is electrically connected to the first auxiliary pixel circuit; and
a $1^{st}$-$2^{nd}$ auxiliary display element arranged in the intermediate area and electrically connected to the $1^{st}$-$2^{nd}$ auxiliary output terminal,
wherein the $1^{st}$-$1^{st}$ auxiliary display element is electrically connected to the $1^{st}$-$1^{st}$ auxiliary output terminal.

20. The display apparatus of claim 19, further comprising:
a second auxiliary pixel circuit arranged in the intermediate area;
a second auxiliary separation circuit arranged in the intermediate area and having a $2^{nd}$-$1^{st}$ auxiliary output terminal, a $2^{nd}$-$2^{nd}$ auxiliary output terminal, and a second auxiliary input terminal that is electrically connected to the second auxiliary pixel circuit;
a $2^{nd}$-$1^{st}$ auxiliary display element arranged in the intermediate area and electrically connected to the $2^{nd}$-$1^{st}$ auxiliary output terminal; and
a $2^{nd}$-$2^{nd}$ auxiliary display element arranged in the intermediate area and electrically connected to the $2^{nd}$-$2^{nd}$ auxiliary output terminal.

21. The display apparatus of claim 20, wherein the first auxiliary separation circuit comprises a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal, and the second auxiliary separation circuit comprises a $2^{nd}$-$1^{st}$ auxiliary transistor connecting the second auxiliary input terminal to the $2^{nd}$-$1^{st}$ auxiliary output terminal and a $2^{nd}$-$2^{nd}$ auxiliary transistor connecting the second auxiliary input terminal to the $2^{nd}$-$2^{nd}$ auxiliary output terminal.

22. The display apparatus of claim 21, further comprising:
a first auxiliary signal line applying an electrical signal to a gate electrode of the $1^{st}$-$1^{st}$ auxiliary transistor and a gate electrode of the $2^{nd}$-$1^{st}$ auxiliary transistor; and
a second auxiliary signal line applying an electrical signal to a gate electrode of the $1^{st}$-$2^{nd}$ auxiliary transistor and a gate electrode of the $2^{nd}$-$2^{nd}$ auxiliary transistor.

23. The display apparatus of claim 22, wherein, when the $1^{st}$-$1^{st}$ auxiliary transistor and the $2^{nd}$-$1^{st}$ auxiliary transistor are turned on through the first auxiliary signal line, the $1^{st}$-$2^{nd}$ auxiliary transistor and the $2^{nd}$-$2^{nd}$ auxiliary transistor are turned off, and when the $1^{st}$-$2^{nd}$ auxiliary transistor and the $2^{nd}$-$2^{nd}$ auxiliary transistor are turned on through the second auxiliary signal line, the $1^{st}$-$1^{st}$ auxiliary transistor and the $2^{nd}$-$1^{st}$ auxiliary transistor are turned off.

24. The display apparatus of claim 19, wherein the first separation circuit comprises a $1^{st}$-$1^{st}$ transistor connecting the first input terminal to the $1^{st}$-$1^{st}$ output terminal and a $1^{st}$-$2^{nd}$ transistor connecting the first input terminal to the $1^{st}$-$2^{nd}$ output terminal, and the first auxiliary separation circuit comprises a $1^{st}$-$1^{st}$ auxiliary transistor connecting the first auxiliary input terminal to the $1^{st}$-$1^{st}$ auxiliary output terminal and a $1^{st}$-$2^{nd}$ auxiliary transistor connecting the first auxiliary input terminal to the $1^{st}$-$2^{nd}$ auxiliary output terminal.

25. The display apparatus of claim 24, further comprising:
a first signal line applying an electrical signal to a gate electrode of the $1^{st}$-$1^{st}$ transistor and a gate electrode of the $1^{st}$-$1^{st}$ auxiliary transistor; and
a second signal line applying an electrical signal to a gate electrode of the $1^{st}$-$2^{nd}$ transistor and a gate electrode of the $1^{st}$-$2^{nd}$ auxiliary transistor.

26. The display apparatus of claim 25, wherein, when the $1^{st}$-$1^{st}$ transistor and the $1^{st}$-$1^{st}$ auxiliary transistor are turned on through the first signal line, the $1^{st}$-$2^{nd}$ transistor and the $1^{st}$-$2^{nd}$ auxiliary transistor are turned off, and when the $1^{st}$-$2^{nd}$ transistor and the $1^{st}$-$2^{nd}$ auxiliary transistor are turned on through the second signal line, the $1^{st}$-$1^{st}$ transistor and the $1^{st}$-$1^{st}$ auxiliary transistor are turned off.

* * * * *